(12) United States Patent
Saitoh

(10) Patent No.: US 12,159,905 B2
(45) Date of Patent: Dec. 3, 2024

(54) SILICON CARBIDE SEMICONDUCTOR DEVICE

(71) Applicant: SUMITOMO ELECTRIC INDUSTRIES, LTD., Osaka (JP)

(72) Inventor: Yu Saitoh, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 406 days.

(21) Appl. No.: 17/753,612

(22) PCT Filed: Nov. 4, 2020

(86) PCT No.: PCT/JP2020/041248
§ 371 (c)(1),
(2) Date: Mar. 9, 2022

(87) PCT Pub. No.: WO2021/095609
PCT Pub. Date: May 20, 2021

(65) Prior Publication Data
US 2022/0359666 A1    Nov. 10, 2022

(30) Foreign Application Priority Data

Nov. 11, 2019  (JP) ................................ 2019-204196

(51) Int. Cl.
*H01L 29/16*    (2006.01)
*H01L 29/423*    (2006.01)
(Continued)

(52) U.S. Cl.
CPC ...... *H01L 29/1608* (2013.01); *H01L 29/4236* (2013.01); *H01L 29/45* (2013.01); *H01L 29/7813* (2013.01)

(58) Field of Classification Search
CPC . H01L 29/1608; H01L 29/4236; H01L 29/45; H01L 29/7813; H01L 29/0634;
(Continued)

(56) References Cited

U.S. PATENT DOCUMENTS

2014/0027784 A1* 1/2014 Wada ................. H01L 21/3065
257/77
2014/0203300 A1* 7/2014 Hatayama ......... H01L 21/30604
257/77

(Continued)

FOREIGN PATENT DOCUMENTS

JP    2014-041990    3/2014
JP    2017-139441    8/2017
(Continued)

*Primary Examiner* — S M Sohel Imtiaz
(74) *Attorney, Agent, or Firm* — IPUSA, PLLC

(57) ABSTRACT

A silicon carbide semiconductor device includes a silicon carbide substrate having a first principal surface and a second principal surface. The silicon carbide substrate includes a drift region, a body region, and a source region. A gate trench is provided on the first principal surface. The silicon carbide substrate further includes a first reduced-electric field region provided between a bottom surface and the second principal surface. The source region includes a first region and a second region, and the first region is interposed between a side surface and the second region. The silicon carbide semiconductor device further includes a contact electrode with an ohmic junction with the second region.

10 Claims, 18 Drawing Sheets

(51) Int. Cl.
*H01L 29/45* (2006.01)
*H01L 29/78* (2006.01)

(58) Field of Classification Search
CPC ............. H01L 29/0869; H01L 29/1095; H01L 29/66068; H01L 29/66477; H01L 29/739; H01L 29/78
See application file for complete search history.

(56) References Cited

U.S. PATENT DOCUMENTS

| | | | |
|---|---|---|---|
| 2017/0221714 A1* | 8/2017 | Wakimoto | .......... H01L 29/4236 |
| 2018/0033876 A1* | 2/2018 | Sugahara | ................ H01L 29/45 |
| 2018/0286945 A1* | 10/2018 | Oka | .................... H01L 29/2003 |

FOREIGN PATENT DOCUMENTS

| | | |
|---|---|---|
| JP | 2018-019046 | 2/2018 |
| JP | 2018-166150 | 10/2018 |
| WO | 2017/169777 | 10/2017 |
| WO | WO-2017169777 A1 * | 10/2017 |

* cited by examiner

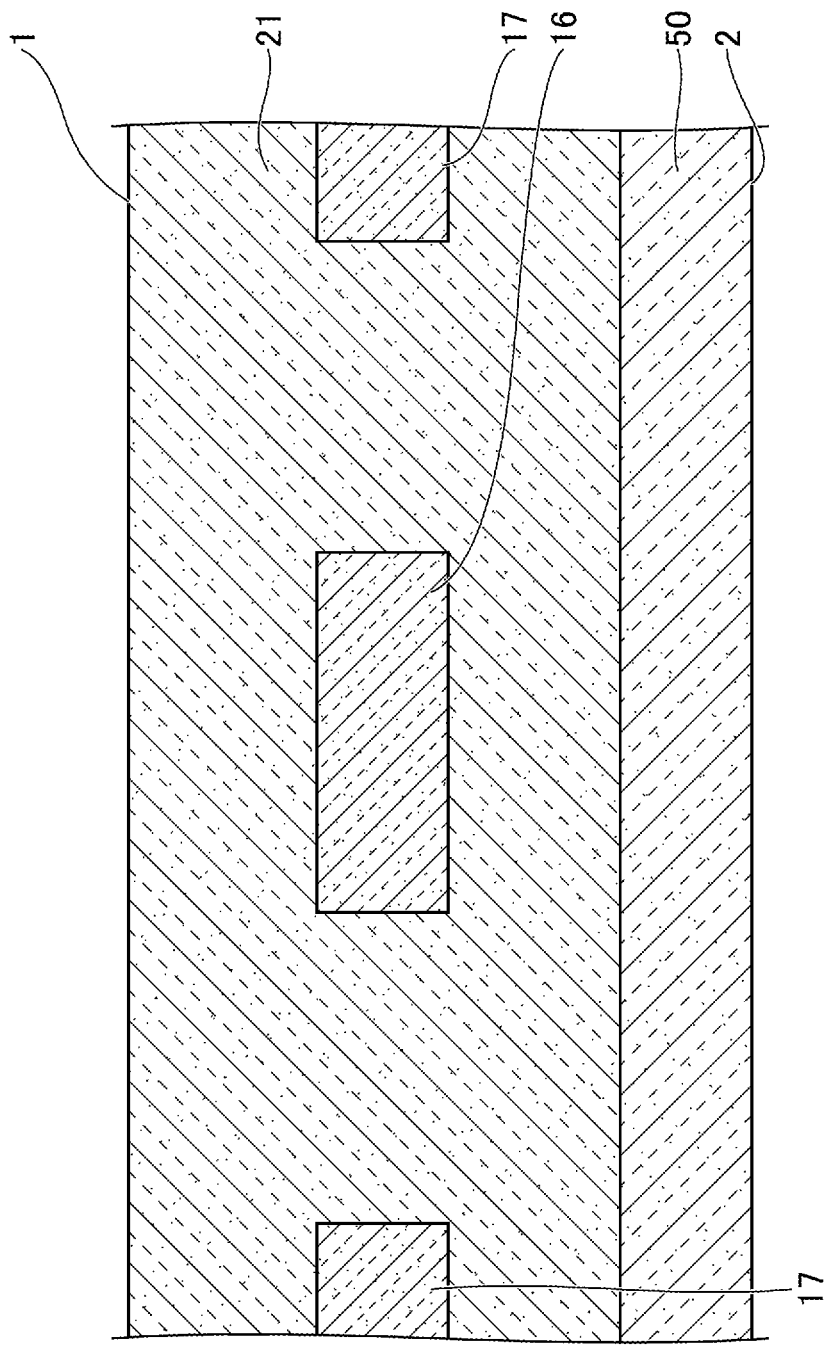

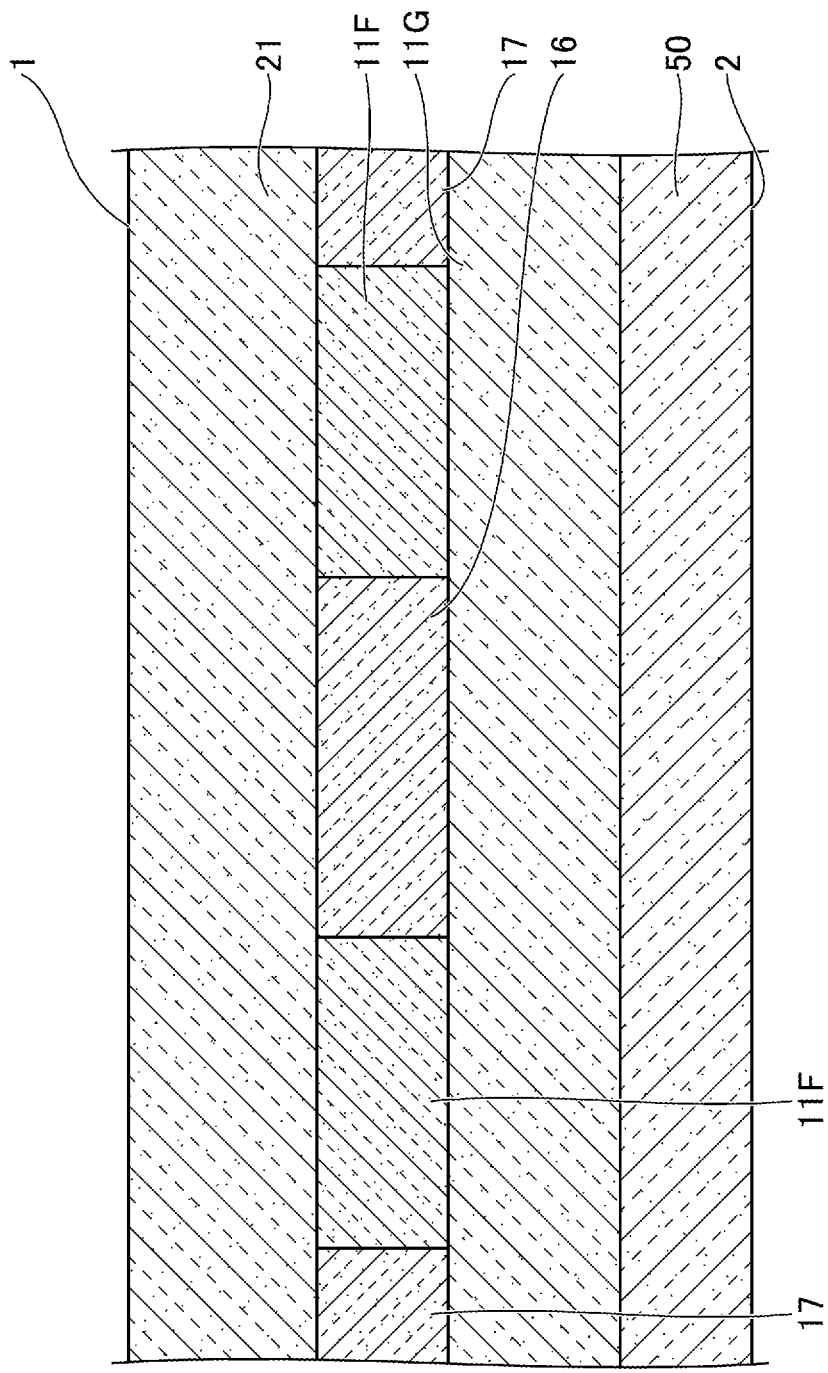

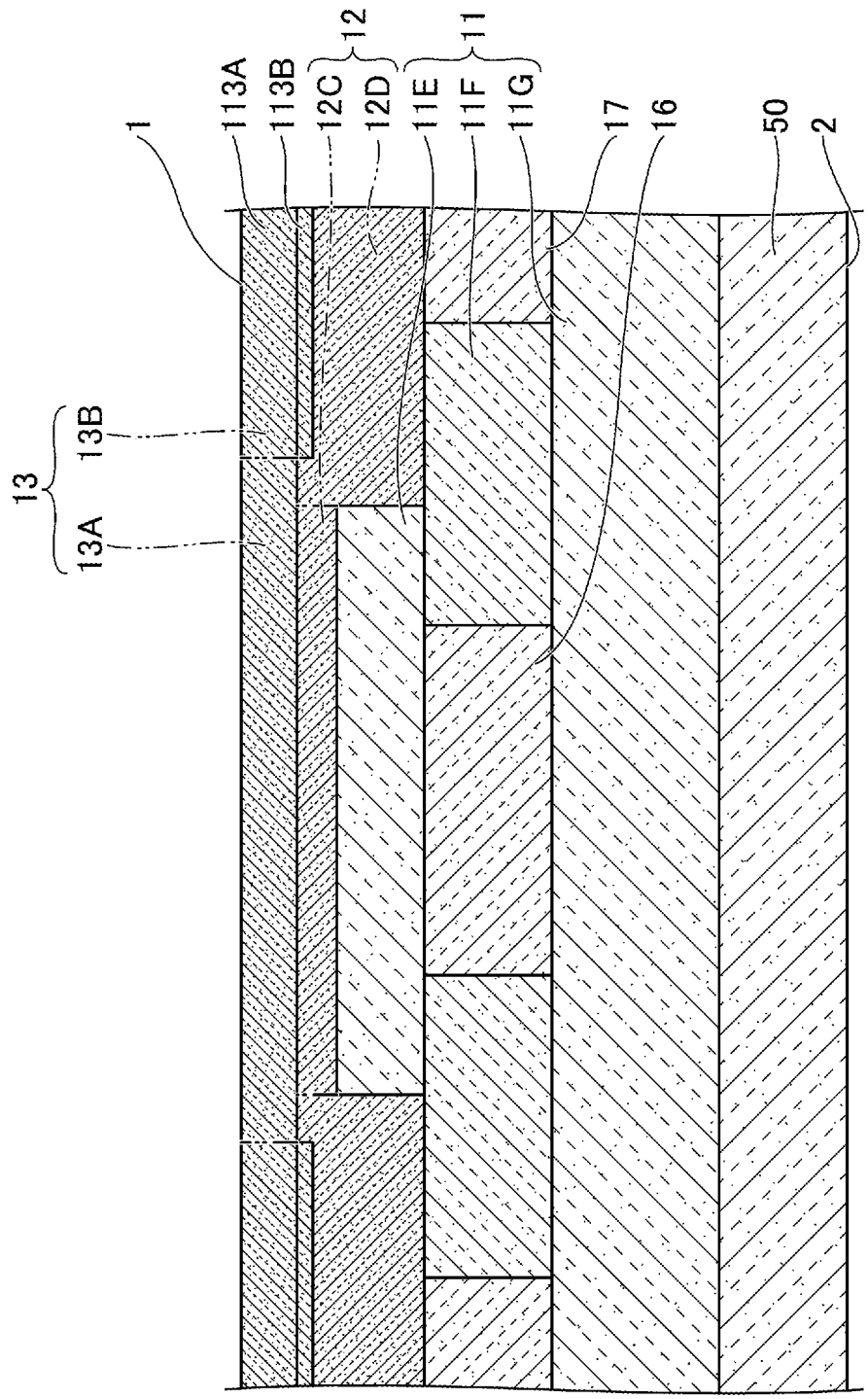

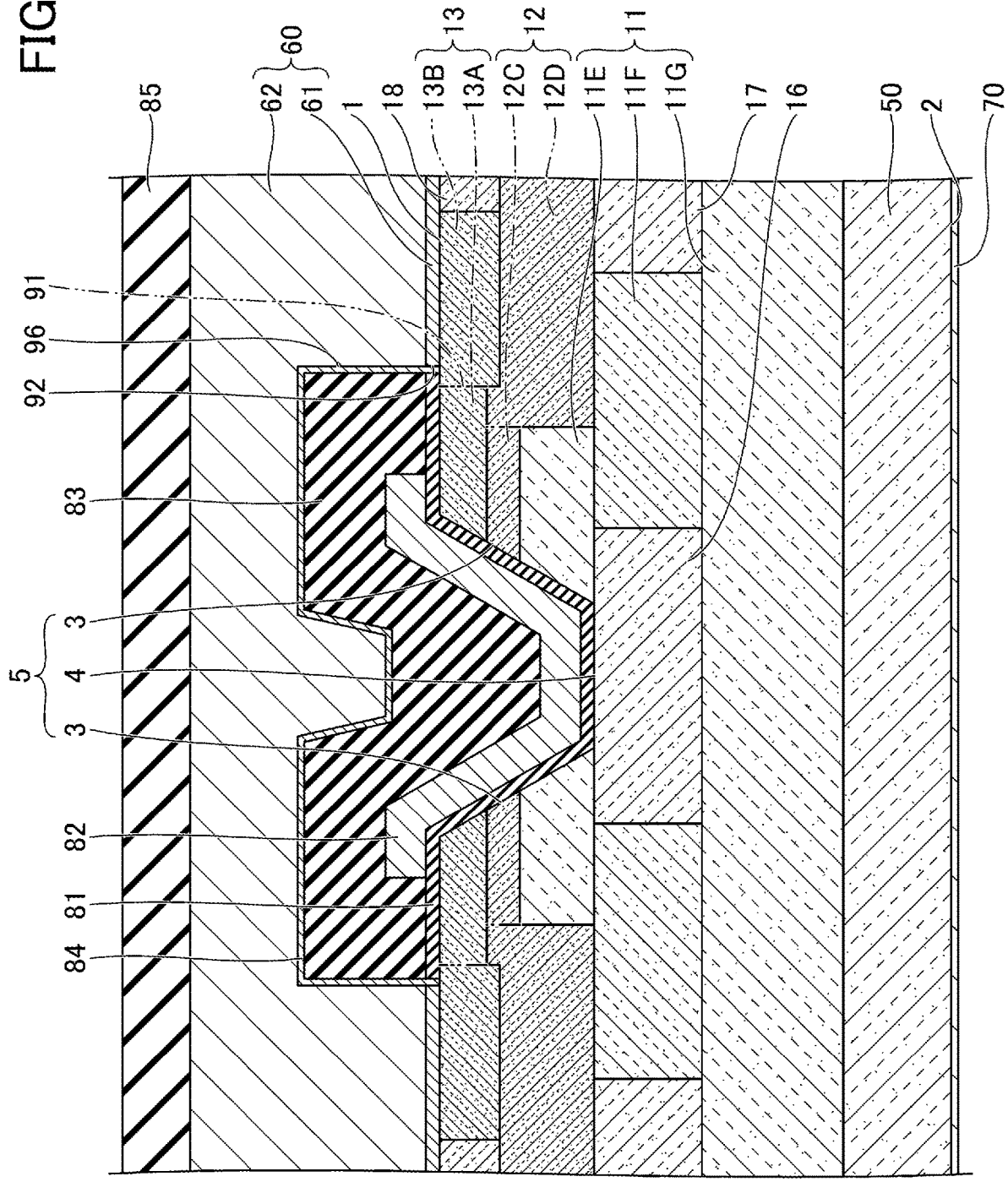

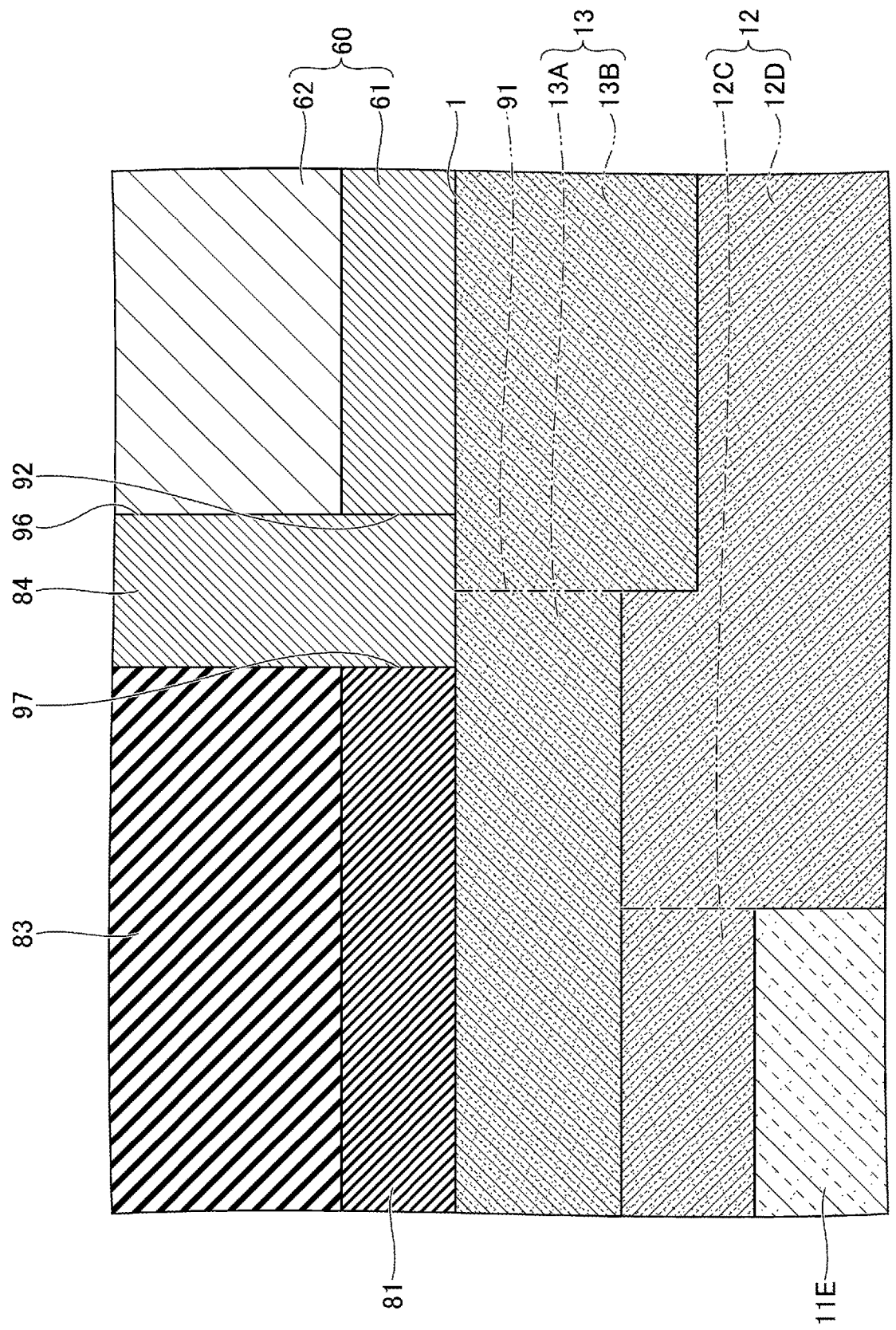

SILICON CARBIDE SEMICONDUCTOR DEVICE

TECHNICAL FIELD

The present disclosure relates to a silicon carbide semiconductor device.

The present application claims priority to Japanese Patent Application No. 2019-204196, filed Nov. 11, 2019, the contents of which are incorporated herein by reference in their entirety.

BACKGROUND ART

As one of silicon carbide semiconductor devices, a trench-type MOSFET (Metal Oxide Semiconductor Field Effect Transistor) is disclosed in which an electric field-shielding region is provided below a gate trench formed on a principal surface (for example, Patent Documents 1 and 2).

CITATION LIST

Patent Document

[Patent Document 1] Japanese Unexamined Patent Application Publication No. 2014-41990
[Patent Document 2] Japanese Unexamined Patent Application Publication No. 2017-139441

SUMMARY

A silicon carbide semiconductor device in the present disclosure includes a silicon carbide substrate having a first principal surface and a second principal surface opposite to the first principal surface. The silicon carbide substrate includes a drift region having a first conductive type, and includes a body region disposed on the drift region and having a second conductive type different from the first conductive type. The silicon carbide substrate includes a source region disposed on the body region so as to be separated from the drift region, the source region having the first conductive type. A gate trench is provided on the first principal surface, the gate trench being defined by: a side surface, which passes through the source region and the body region and reaches the drift region; and a bottom surface coupled to the side surface. The silicon carbide substrate further includes a first reduced-electric field region provided between the bottom surface and the second principal surface and having the second conductive type. The source region includes a first region contacting the side surface, the first region having a first thickness. The source region includes a second region having a second thickness greater than the first thickness, the first region being interposed between the side surface and the second region. The silicon carbide semiconductor device further includes a contact electrode with an ohmic junction with the second region.

BRIEF DESCRIPTION OF DRAWINGS

FIG. 2B is a cross-sectional view (second part) of the silicon carbide semiconductor device according to the embodiment, the cross-sectional view being for describing the method of manufacturing the silicon carbide semiconductor device;
FIG. 2C is a cross-sectional view (third part) of the silicon carbide semiconductor device according to the embodiment, the cross-sectional view being for describing the method of manufacturing the silicon carbide semiconductor device;
FIG. 2G is a cross-sectional view (seventh part) of the silicon carbide semiconductor device according to the embodiment, the cross-sectional view being for describing the method of manufacturing the silicon carbide semiconductor device;
FIG. 2O is a cross-sectional view (fifteenth part) of the silicon carbide semiconductor device according to the embodiment, the cross-sectional view being for describing the method of manufacturing the silicon carbide semiconductor device;

FIG. 3 is a cross-sectional view of an example of association of a source region, a gate dielectric film, and a barrier metal film with a contact electrode.

DESCRIPTION OF EMBODIMENTS

Figure 1:
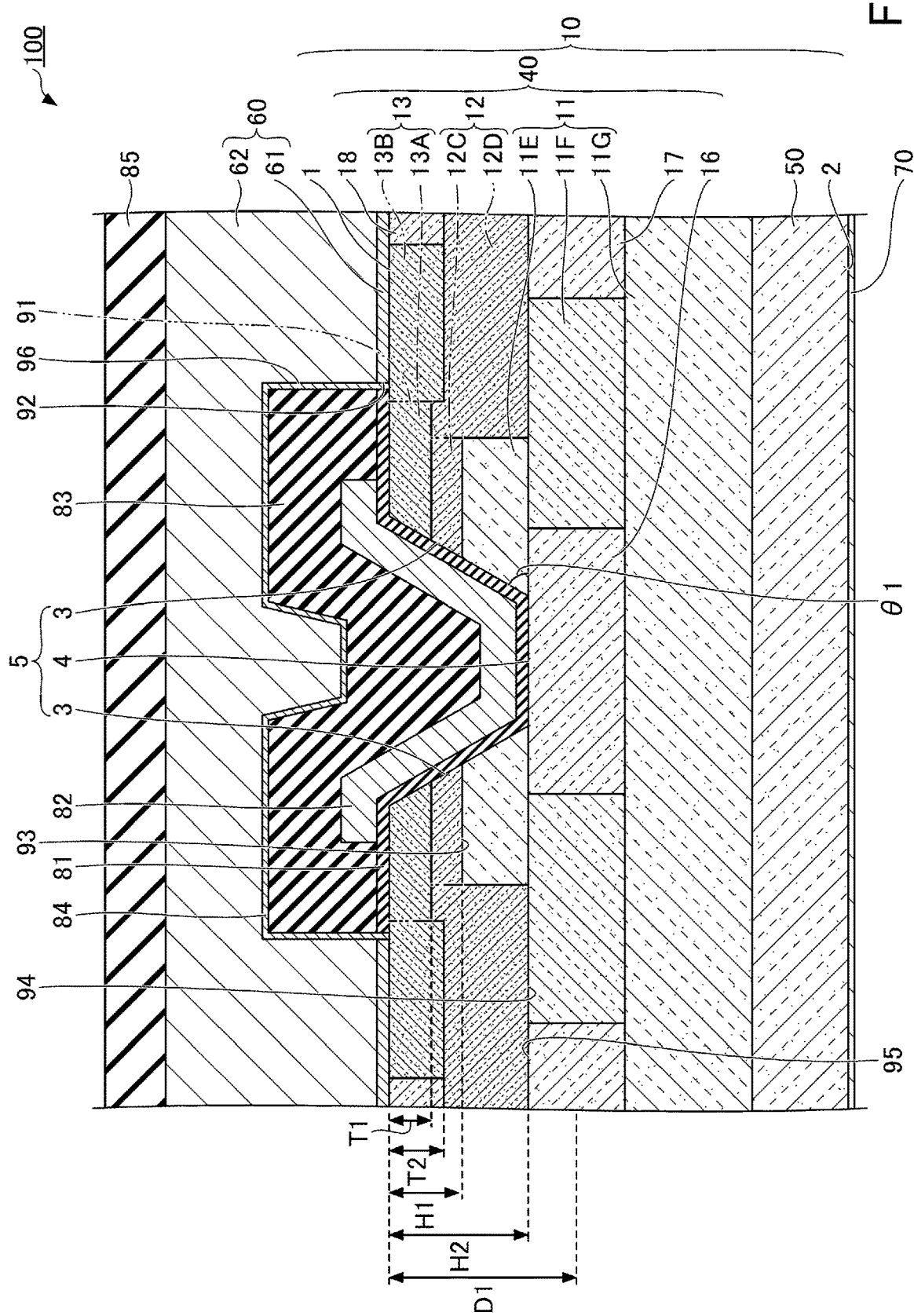
FIG. 1 is a cross-sectional view of the configuration of a silicon carbide semiconductor device according to an embodiment.

Problem to be Solved by the Present Disclosure

In order to reduce a cost, it is desirable to form a shallow electric field-shielding region with reference to a principal surface. However, in the configuration of conventional silicon carbide semiconductor devices, if the shallow electric field-shielding region is formed, characteristics may become deteriorated.

Accordingly, an object of the present disclosure is to provide a silicon carbide semiconductor device that can reduce a cost, while suppressing degradation of characteristics.

Effect of Present Disclosure

In the present disclosure, a cost can be reduced while suppressing degradation of characteristics.

One or more embodiments are described below.

Description of Embodiments of the Present Disclosure

First, one or more embodiments of the present disclosure will be described by listing. In the following description, the same numbers denote the same or corresponding elements, and description for those elements will not be repeatedly provided. In the description relating to crystallography herein, an individual orientation is expressed using [ ], a texture orientation is expressed using < >, an individual plane is expressed using ( ) and a texture plane is expressed using { }. Although a negative crystallographic index is generally expressed by placing the superscript "-" (bar) on a given number, a negative sign is placed before the number in this description.

[1] A silicon carbide semiconductor device according to one aspect of the present disclosure includes a silicon carbide substrate having a first principal surface and a second principal surface opposite to the first principal surface. The silicon carbide substrate includes a drift region having a first conductive type and includes a body region disposed on the drift region and having a second conductive type different from the first conductive type. The silicon carbide substrate includes a source region disposed on the body region so as to be separated from the drift region, the source region having the first conductive type. A gate trench is provided on the first principal surface, the gate trench being defined by: a side surface, which passes through the source region and the body region and reaches the drift region; and a bottom surface coupled to the side surface. The silicon carbide substrate further includes a first reduced-electric field region provided between the bottom surface and the second principal surface and having the second conductive type. The source region includes a first region contacting the side surface, the first region having a first thickness. The source region includes a second region having a second thickness greater than the first thickness, the first region being interposed between the side surface and the second region. The silicon carbide semiconductor device further includes a contact electrode with an ohmic junction with the second region.

A contact electrode has an ohmic junction with a second region. The consumption of a first region is suppressed even if a portion of the second region is consumed during heat treatment for the ohmic junction. Thus, a function of a source region can be secured. With this arrangement, a peak depth for an effective concentration of a second conductive-type impurity in a first reduced-electric field region, with reference to a first principal surface, can be reduced and thus excellent characteristics can be obtained. When the peak depth is reduced, regrowth of an epitaxial layer is not required after formation of the first reduced-electric field region. Thus, a cost caused by the regrowth of the epitaxial layer can be reduced. Also, during the formation of the first reduced-electric field region, high energy ion implantation is not required. Thus, an increased cost caused by the high energy ion implantation can be avoided. Further, as a first thickness is reduced, a short circuit current is reduced, and thus short circuit capability can be increased. Further, as a smaller area that contacts a side surface of a drift region is obtained, feedback capacitance can be improved. By reducing the feedback capacitance, losses in switching are reduced, and thus a switching speed can be also increased.

[2] In [1], a contact electrode has a side end surface that faces a side of a gate trench in a direction parallel to a first principal surface, and the side end surface may be spaced farther apart from the gate trench than an interface between a first region and a second region, in a plan view viewed in a direction perpendicular to a first principal surface. When the side end surface is spaced farther apart from the gate trench than an interface, consumption of the first region can be more reliably suppressed.

[3] In [2], a silicon carbide semiconductor device further includes a gate dielectric film contacting a side surface and a bottom surface and includes a gate electrode disposed on the gate dielectric film such that the gate dielectric film is interposed between a gate electrode and a silicon carbide substrate. The silicon carbide semiconductor device further includes an interlayer dielectric film disposed so as to cover the gate electrode. The gate dielectric film or the interlayer dielectric film may directly contact the first region. When the gate dielectric film or the interlayer dielectric film directly contacts the first region, consumption of the first region can be suppressed more reliably.

[4] In [1] to [3], a body region includes a third region having a first lower end surface coupled to a side surface and includes a fourth region having a second lower end surface coupled to the first lower end surface, a third region being interposed between the fourth region and the side surface. A second distance from a first principal surface to the second lower end surface is greater than or equal to a first distance from the first principal surface to the first lower end surface, and the second lower end surface overlaps the second region and may be wider than the second region, in a plan view viewed in a direction perpendicular to the first principal surface. When the body region includes the fourth region with the second lower end surface, in addition to the third region with the first lower end surface, punch-through between the second region and a drift region can be suppressed.

[5] In [4], a silicon carbide substrate is disposed between a second lower surface and a second principal surface and further may include a second reduced-electric field region having a second conductive type. When the second reduced-electric field region is provided between the second lower end surface and the second principal surface, electric insulation breakdown in a gate dielectric film can be suppressed, and excellent dielectric withstand pressure can be obtained.

[6] In [5], an upper end surface of a second reduced-electric field region and a second lower surface may contact each other. When the upper end surface of the second reduced-electric field region and the second lower surface of the fourth region contact each other, a better dielectric withstand voltage can be obtained more reliably.

[7] A second thickness may be 0.2 µm or more in [1] to [6]. When the second thickness may be 0.2 µm or more, short-circuiting between a contact electrode and a body region can be suppressed more reliably.

[8] In [1] to [7], a second thickness may be greater than or equal to 1.1 times and less than or equal to 5.0 times a first thickness. When the second thickness is greater than or equal to 1.1 times and less than or equal to 5.0 times the first thickness, a cost can be reduced while suppressing degradation of characteristics more reliably.

[9] In [1] to [8], a peak depth for an effective concentration of a second conductive-type impurity in a first reduced-electric field region, with reference to a first principal surface, may be 1.0 µm or less. When the peak depth for the effective concentration of the second conductive type impurity in the first reduced-electric field region, with reference to the first principal surface, is 1.0 µm or less, a cost can be more reliably reduced.

[10] In [1] to [9], a side surface of a gate trench may include a {0-33-8} plane. When the side surface has the {0-33-8} plane, excellent mobility for the side surface of the gate trench, and thus channel resistance can be reduced.

Embodiments of the Present Disclosure

Embodiments of the present disclosure relate to a vertical MOSFET (silicon carbide semiconductor device). FIG. 1 is a cross-sectional view of the configuration of the silicon carbide semiconductor device according to an embodiment.

As illustrated in FIG. 1, a MOSFET 100 according to the present embodiment mainly includes a silicon carbide substrate 10, a gate dielectric film 81, a gate electrode 82, an interlayer dielectric film 83, a source electrode 60, a drain electrode 70, a barrier metal film 84, and a passivation film 85. The silicon carbide substrate 10 includes a silicon carbide single crystal substrate 50 and a silicon carbide epitaxial layer 40 on the silicon carbide single crystal substrate 50. The silicon carbide substrate 10 has a first principal surface 1 and a second principal surface 2 opposite the first principal surface 1. The silicon carbide epitaxial layer 40 forms the first principal surface 1, and the silicon carbide single crystal substrate 50 forms the second principal surface 2. The silicon carbide single crystal substrate 50 and the silicon carbide epitaxial layer 40 are composed of hexagonal silicon carbide of polytype 4H, for example. The silicon carbide single crystal substrate 50 has an n-type impurity such as nitrogen (N) and is an n-type (first conductive type). A maximum diameter of the first principal surface 1 of the silicon carbide substrate 10 is, for example, 100 mm or more, and preferably 150 mm or more.

The first principal surface 1 is a {0001} plane or a surface obtained through the {0001} plane that is inclined, in an off direction, at an off angle of 8° or less. Preferably, the first principal surface 1 is a (000-1) plane or a surface obtained through the (000-1) plane that is inclined at an off angle of 8° or less in the off direction. The off direction may be, for example, a <11-20> direction or a <1-100> direction. For example, the off angle may be greater than or equal to 1°, or may be greater than or equal to 2°. The off angle may be less than or equal to 6°, or may be less than or equal to 4°.

The silicon carbide epitaxial layer 40 mainly includes a drift region 11, a body region 12, a source region 13, a first reduced-electric field region 16, a second reduced-electric field region 17, and a contact region 18.

The drift region 11 includes an n-type impurity, such as nitrogen or phosphorus (P), and is an n-conductive type. The drift region 11 mainly includes, for example, a fifth region 11E, a sixth region 11F, and a seventh region 11G.

The body region 12 is provided on the drift region 11. The body region 12 includes a p-type impurity, such as aluminum (Al), and is a p (second conductive type)-conductive type. The body region 12 mainly includes, for example, a third region 12C and a fourth region 12D.

The source region 13 is provided on the body region 12 so as to be separated from the drift region 11, where the body region 12 is used for the separation. The source region 13 includes an n-type impurity, such as nitrogen or phosphorus, and is an n-conductive type. The source region 13 forms the first principal surface 1. The source region 13 mainly includes, for example, a first region 13A and a second region 13B.

The contact region 18 includes a p-type impurity such as aluminum and is a p-conductive type. An effective concentration of the p-type impurity in the contact region 18 is higher than an effective concentration of the p-type impurity in the body region 12, for example. The contact region 18 passes through the source region 13 and contacts the body region 12. The contact region 18 forms the first principal surface 1. The effective concentration of the p-type impurity in the contact region 18 is, for example, greater than or equal to $1 \times 10^{18}$ cm$^{-3}$ and less than or equal to $1 \times 10^{20}$ cm$^{-3}$.

A gate trench 5 defined by a side surface 3 and a bottom surface 4 is provided on the first principal surface 1. The side surface 3 passes through the source region 13, the body region 12 and the drift region 11, and reaches the first reduced-electric field region 16. The bottom surface 4 meets the side surface 3. The bottom surface 4 is located in the first reduced-electric field region 16. The bottom surface 4 is, for example, a plane parallel to the second principal surface 2. An angle θ1 of the side surface 3 relative to a plane including the bottom surface 4 is, for example, greater than or equal to 45° and less than or equal to 65°. The angle θ1 may be, for example, 50° or greater. The angle θ1 may be, for example, 60° or less. The side surface 3 preferably has a {0-33-8} plane. The {0-33-8} plane is a crystalline plane that enables excellent mobility. The gate trench 5 extends in a direction parallel to, for example, the first principal surface 1 so as to be in a strip pattern. The gate trench 5 may extend so as to be in a honeycomb pattern, or alternatively, gate trenches 5 may be interspersed in an island pattern.

The first reduced-electric field region 16 includes a p-type impurity, such as Al, and is a p-conductive type. The first reduced-electric field region 16 is disposed between the bottom surface 4 of the gate trench 5 and the second principal surface 2. An upper end surface of the first reduced-electric field region 16 includes, for example, the bottom surface 4 of the gate trench 5. A portion of the upper end surface of the first reduced-electric field region 16 faces a portion of the lower end surface of the body region 12. The first reduced-electric field region 16 may be electrically coupled to the source electrode 60. An effective concentration of the p-type impurity in the first reduced-electric field region 16 is, for example, greater than or equal to $5 \times 10^{17}$ cm$^{-3}$ and less than or equal to $5 \times 10^{18}$ cm$^{-3}$. A peak depth D1 for the effective concentration of the p-type impurity in the first reduced-electric field region 16, with reference to the first principal surface 1, is, for example, 1.0 µm or less. The peak depth D1 may be greater than or equal to 0.8 µm and less than or equal to 1.0 µm. The thickness of the first reduced-electric field region 16, with reference to the first principal surface 1, may be greater than or equal to 0.4 µm and less than or equal to 0.6 µm.

The second reduced-electric field region 17 includes a p-type impurity, such as Al, and is a p-conductive type. The second reduced-electric field region 17 contacts the drift region 11. The second reduced-electric field region 17 may further contact the body region 12. The second reduced-electric field region 17 is on the side of the second principal surface 2 with respect to the body region 12. The effective concentration of the p-type impurity in the second reduced-electric field region 17 may be approximately the same as the effective concentration of the p-type impurity in the first reduced-electric field region 16. The effective concentration of the p-type impurity in the second reduced-electric field region 17 is, for example, greater than or equal to $5 \times 10^{17}$ cm$^{-3}$ and less than or equal to $5 \times 10^{18}$ cm$^{-3}$. A peak depth for the effective concentration of the p-type impurity in the second reduced-electric field region 17, with reference to the first principal surface 1, may be, for example, 1 µm or less. The thickness of the second reduced-electric field region 17 in the direction perpendicular to the first principal surface 1 may be greater than or equal to 0.4 µm and less than or equal to 0.6 µm.

A fifth region 11E of the drift region 11 is interposed between the body region 12 and the first reduced-electric field region 16. The fifth region 11E is in contact with each of the body region 12 and the first reduced-electric field region 16. The fifth region 11E is on the side of a second principal surface 2 with respect to the body region 12. The fifth region 11E is on the side of a first principal surface 1 with respect to the first reduced-electric field region 16. The effective concentration of the n-type impurity in the fifth region 11E is, for example, greater than or equal to $5 \times 10^{15}$ cm$^{-3}$ and less than or equal to $5 \times 10^{16}$ cm$^{-3}$.

The sixth region 11F is on the side of the second principal surface 2 with respect to the fifth region 11E. The sixth region 11F is coupled to the fifth region 11E. The sixth region 11F is interposed between the first reduced-electric field region 16 and the second reduced-electric field region 17. The sixth region 11F is in contact with each of the first reduced-electric field region 16 and the second reduced-electric field region 17. The sixth region 11F, the first reduced-electric field region 16, and the second reduced-electric field region 17 may be coplanar with the second principal surface 2. The effective concentration of the n-type impurity in the sixth region 11F may be greater than the effective concentration for the fifth region 11E. The effective concentration of the n-type impurity in the sixth region 11F is, for example, greater than or equal to $5 \times 10^{16}$ cm$^{-3}$ and less than or equal to $5 \times 10^{17}$ cm$^{-3}$.

A seventh region 11G is on the side of the second principal surface 2 with respect to the sixth region 11F. The seventh region 11G is coupled to the sixth region 11F. The seventh region 11G is in contact with each of the first reduced-electric field region 16 and the second reduced-electric field region 17. The seventh region 11G is on the side of the second principal surface 2 with respect to each of the first reduced-electric field region 16 and the second reduced-electric field region 17. The seventh region 11G may be interposed between the sixth region 11F and the silicon carbide single crystal substrate 50. The seventh region 11G may be coupled to the silicon carbide single crystal substrate 50. The effective concentration of the n-type impurity in the seventh region 11G may be less than the effective concentration of the n-type impurity in the sixth region 11F. The effective concentration of the n-type impurity in the seventh region 11G is, for example, greater than or equal to $5 \times 10^{15}$ cm$^{-3}$ and less than or equal to $5 \times 10^{16}$ cm$^{-3}$.

A third region 12C of the body region 12 is interposed between the source region 13 and the fifth region 11E, in a direction perpendicular to the second principal surface 2. The third region 12C contacts each of the source region 13 and the fifth region 11E. The third region 12C is on the side of the second principal surface 2 with respect to the source region 13. The third region 12C is on the side of the first principal surface 1 with respect to the fifth region 11E. The third region 12C also contacts the side surface 3. The third region 12C includes a first lower end surface 93 coupled to the side surface 3. The first lower end surface 93 contacts an upper end surface of the fifth region 11E. A distance H1 from the first principal surface 1 of the first lower end surface 93 is, for example, greater than or equal to 0.2 µm and less than or equal to 0.5 µm. The effective concentration of the p-type impurity in the third region 12C is, for example, greater than or equal to $5 \times 10^{17}$ cm$^{-3}$ and less than or equal to $5 \times 10^{18}$ cm$^{-3}$. A short channel effect (punch-through) can be obtained when a depletion region extends from a pn junction region to a channel region, and thus the entire channel region becomes the depletion region. By increasing the effective concentration of the p-type impurity in the third region 12C, extension of the depletion region to be formed in the channel region can be reduced. The effective concentration of the p-type impurity in the third region 12C may be greater than the effective concentration of the n-type impurity in the fifth region 11E.

The third region 12C is interposed between a fourth region 12D and the side surface 3, in a plan view viewed in a direction perpendicular to the first principal surface 1. That is, the third region 12C is interposed between the fourth region 12D and the side surface 3, in a direction parallel to the first principal surface 1. The fourth region 12D is spaced farther apart from the gate trench 5 than the third region 12C. The fourth region 12D is interposed between the source region 13 and the second reduced-electric field region 17, in a direction perpendicular to the second principal surface 2. The fourth region 12D is in contact with each of the contact region 18, the source region 13, the third region 12C, and the fifth region 11E. The fourth region 12D may further contact the second reduced-electric field region 17. The fourth region 12D may further contact the sixth region 11F. The fourth region 12D is on the side of the second principal surface 2 with respect to the source region 13. The fourth region 12D is on the side of the first principal surface 1 with respect to the second reduced-electric field region 17. The fourth region 12D includes a second lower end surface 94 coupled to the first lower end surface 93. The second lower end surface 94 and the upper end surface 95 of the second reduced-electric field region 17 may contact each other. The second lower end surface 94 may contact an upper end surface of the sixth region 11F. A distance H2 from the first principal surface 1 of the second lower end surface 94 is greater than or equal to a distance H1 from the first principal surface 1 of the first lower end surface 93. The distance H2 from the first principal surface 1 of the second lower end surface 94 is, for example, greater than or equal to 0.7 μm and less than or equal to 0.9 μm. The effective concentration of the p-type impurity in the fourth region 12D may be less than the effective concentration of the p-type impurity in the third region 12C. The effective concentration of the p-type impurity in the fourth region 12D may be less than the effective concentration of the p-type impurity in the second reduced-electric field region 17. The effective concentration of the p-type impurity in the fourth region 12D is, for example, greater than or equal to $5 \times 10^{16}$ cm$^{-3}$ and less than or equal to $5 \times 10^{18}$ cm$^{-3}$.

A first region 13A of the source region 13 is disposed on the body region 12 in a direction perpendicular to the second principal surface 2. The first region 13A contacts the body region 12. The first region 13A is on the side of the first principal surface 1 with respect to the body region 12. The first region 13A also contacts the side surface 3. The first region 13A has a first thickness T1. The first thickness T1 is, for example, greater than or equal to 0.1 μm and less than or equal to 0.3 μm. A portion of the first region 13A may be on the third region 12C, and another portion may be on the fourth region 12D. The first region 13A is covered by a gate dielectric film 81. The first region 13A directly contacts the gate dielectric film 81. The effective concentration of the n-type impurity in the first region 13A is, for example, greater than or equal to $5 \times 10^{18}$ cm$^{-3}$ and less than or equal to $5 \times 10^{19}$ cm$^{-3}$.

The first region 13A is interposed between the second region 13B and the side surface 3. That is, the first region 13A is interposed between the second region 13B and the side surface 3, in the direction parallel to the first principal surface 1. The second region 13B is spaced farther apart from the gate trench 5 than the first region 13A. The second region 13B is on the fourth region 12D of the body region 12 in the direction perpendicular to the second principal surface 2. The second region 13B contacts the fourth region 12D. The second region 13B is on the side of the first principal surface 1 with respect to the fourth region 12D. In a plan view viewed in the direction perpendicular to the first principal surface 1, the second lower end surface 94 of the fourth region 12D overlaps the second region 13B and is wider than the second region 13B. The second region 13B has a second thickness T2 that is greater than the first thickness T1. The second region 13B may be greater than equal to 1.1 times and less than or equal to 5.0 times the first thickness T1. The second thickness T2 is, for example, 0.2 μm or more. The second thickness T2 may be greater than or equal to 0.2 μm and less than or equal to 0.5 μm. A contact electrode 61 is provided on the second region 13B. The second region 13B contacts the contact electrode 61. The effective concentration of the n-type impurity in the second region 13B may be approximately the same as the effective concentration of the n-type impurity in the first region 13A. The effective concentration of the n-type impurity in the second region 13B is, for example, greater than or equal to $5 \times 10^{18}$ cm$^{-3}$ and less than or equal to $5 \times 10^{19}$ cm$^{-3}$.

The gate dielectric film 81 is, for example, an oxide film. The gate dielectric film 81 is made of a material that includes, for example, silicon dioxide. The gate dielectric film 81 contacts the side surface 3 and the bottom surface 4. The gate dielectric film 81 contacts the first reduced-electric field region 16, at the bottom surface 4. The gate dielectric film 81, at the side surface 3, contacts each of the source region 13, the body region 12, and the drift region 11. The gate dielectric film 81 may contact the first region 13A of the source region 13 at the first principal surface 1. The gate dielectric film 81 may further contact the second region 13B of the source region 13 at the first principal surface 1.

A gate electrode 82 is provided on the gate dielectric film 81. The gate electrode 82 is made of polysilicon (poly-Si) that includes, for example, a conductive impurity. The gate electrode 82 is disposed within the gate trench 5. A portion of the gate electrode 82 may be disposed on the first principal surface 1.

The interlayer dielectric film 83 is provided in contact with the gate electrode 82 and the gate dielectric film 81. The interlayer dielectric film 83 is made of a material that includes, for example, silicon dioxide. The interlayer dielectric film 83 electrically insulates the gate electrode 82 and the source electrode 60. A portion of the interlayer dielectric film 83 may be provided within the gate trench 5.

A barrier metal film 84 covers the top surface and side surface of the interlayer dielectric film 83, as well as the side surface of the gate dielectric film 81. The barrier metal film 84 contacts each of the interlayer dielectric film 83 and the gate dielectric film 81. The barrier metal film 84 is made of a material that includes, for example, titanium nitride (TiN).

The source electrode 60 contacts the first principal surface 1. The source electrode 60 includes a contact electrode 61 and a source line 62. The contact electrode 61 may contact the source region 13 and the contact region 18, at the first principal surface 1. The contact electrode 61 is made of a material that includes, for example, nickel silicide (NiSi). The contact electrode 61 may be made of a material that includes titanium (Ti), Al, and Si. The contact electrode 61 has an ohmic junction with the second region 13B. The contact electrode 61 may have an ohmic junction with the contact region 18. The contact electrode 61 is spaced apart from the first region 13A in a plan view viewed in the direction perpendicular to the first principal surface 1. The contact electrode 61 has a side end surface 92 that faces a side of the gate trench 5 in the direction parallel to the first principal surface 1. For example, in a plan view viewed in the direction perpendicular to the first principal surface 1, the side end surface 92 is spaced farther apart from the gate trench 5 than an interface 91 between the first region 13A and the second region 13B. The source line 62 covers the top surface and side surface of the barrier metal film 84, as well as the top surface of the contact electrode 61. The source line 62 contacts each of the barrier metal film 84 and the contact electrode 61. The source line 62 is made of a material that includes, for example, Al.

A passivation film 85 covers the top surface of the source line 62. The passivation film 85 contacts the source line 62. The passivation film 85 is made of a material that includes, for example, polyimide.

A drain electrode 70 contacts the second principal surface 2. The drain electrode 70 contacts a silicon carbide single crystal substrate 50, at the second principal surface 2. The drain electrode 70 is electrically coupled to a drift region 11. The drain electrode 70 is made of a material that includes, for example, NiSi. The drain electrode 70 may be made of a material that includes Ti, Al, and Si. The drain electrode 70 has an ohmic junction with the silicon carbide single crystal substrate 50.

The upper end surface of the first reduced-electric field region 16 may be separated from the bottom surface 4, in the direction perpendicular to the second principal surface 2. In this case, for example, the bottom surface 4 may be located in the drift region 11, and the side surface 3 may pass through the source region 13 and the body region 12 and reach the drift region 11. For example, the fifth region 11E may be disposed between the upper end surface of the first reduced-electric field region 16 and the bottom surface 4.

The upper end surface 95 of the second reduced-electric field region 17 may be separated from the second lower end surface 94 of the fourth region 12D, in the direction perpendicular to the second principal surface 2. For example, the fifth region 11E may be disposed between the upper end surface 95 and the second lower end surface 94.

Between the silicon carbide single crystal substrate 50 and the seventh region 11G, a buffer layer that includes an n-type impurity such as nitrogen and is an n-conductive type may be provided. The effective concentration of the n-type impurity in the buffer layer may be greater than the effective concentration of the n-type impurity in the seventh region 11G.

Further, in the direction parallel to the first principal surface 1, an end of the gate dielectric film 81 is separated from the barrier metal film 84, and the interlayer dielectric film 83 may directly contact the first region 13A. For example, the interlayer dielectric film 83 may be formed between the end of the gate dielectric film 81 and the barrier metal film 84.

Figure 2A:
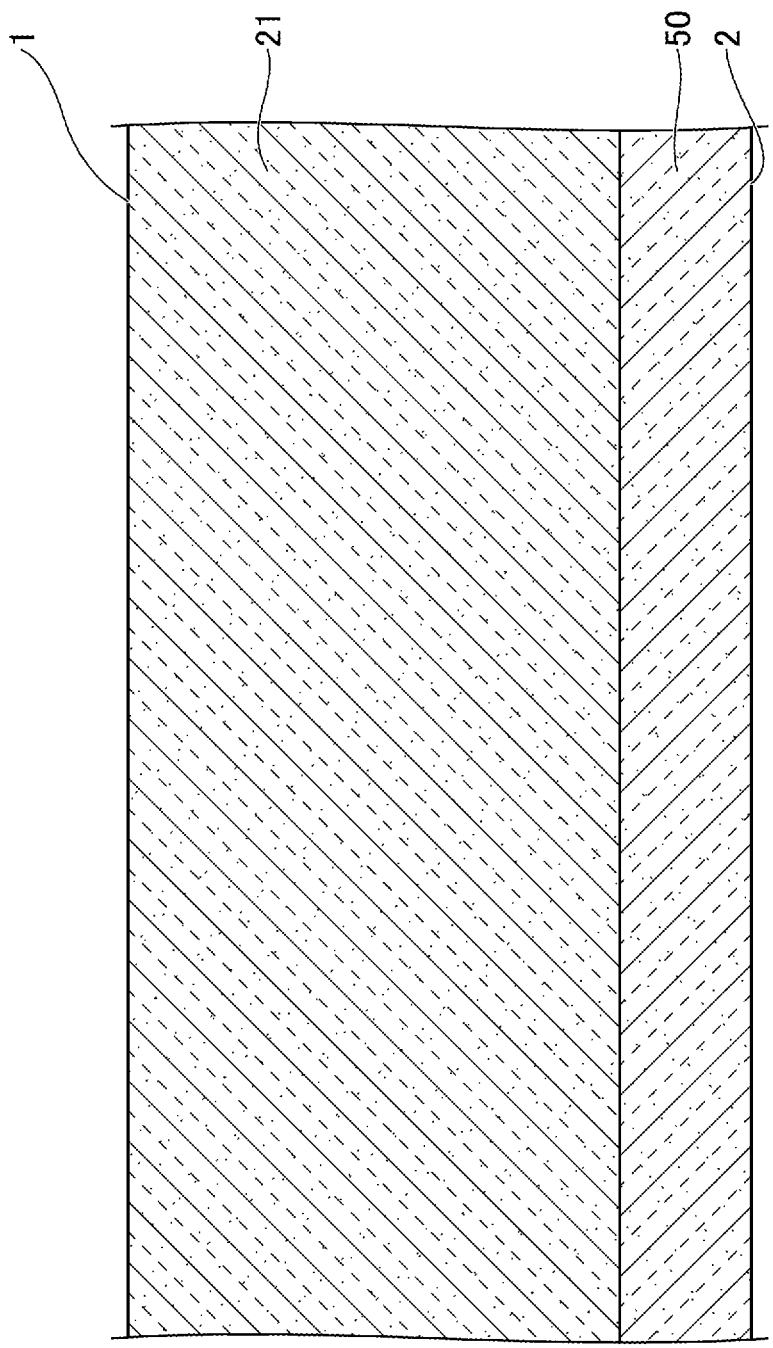
FIG. 2A is a cross-sectional view (first part) of the silicon carbide semiconductor device according to the embodiment, the cross-sectional view being for describing a method of manufacturing the silicon carbide semiconductor device.

Hereafter, a method of manufacturing the MOSFET 100 according to the embodiment will be described. FIGS. 2A to 2O are cross-sectional views of the MOSFET 100 according to the embodiment, the views being for describing the method of manufacturing the MOSFET 100.

First, as illustrated in FIG. 2A, a step of preparing the silicon carbide single crystal substrate 50 is performed. The silicon carbide single crystal substrate 50 is prepared by, for example, slicing a silicon carbide ingot (not illustrated) produced in a sublimation process. A buffer layer (not illustrated) may be formed on the silicon carbide single crystal substrate 50. The buffer layer can be formed in, for example, chemical vapor deposition (CVD) in which a mixture of silane ($SiH_4$) and propane ($C_3H_8$) is used as a rare gas and further hydrogen ($H_2$) is used as a carrier gas. During epitaxial growth of the buffer layer, the n-type impurity such as nitrogen may be introduced into the buffer layer.

Then, as illustrated in FIG. 2A, a step of forming the epitaxial layer 21 is performed. For example, the epitaxial layer 21 is formed on the silicon carbide single crystal substrate 50 by CVD in which a mixture of silane and propane is used as a material gas and further hydrogen is used as a carrier gas. During epitaxial growth, the n-type impurity, such as nitrogen, is introduced into the epitaxial layer 21. The epitaxial layer 21 has an n-conductive type. The effective concentration of the n-type impurity in the epitaxial layer 21 may be less than the effective concentration of the n-type impurity in the buffer layer.

Then, as illustrated in FIG. 2B, a step of forming the first reduced-electric field region 16 and the second reduced-electric field region 17 is performed. For example, a mask layer (not illustrated) having an opening is formed in a region in which each of the first reduced-electric field region 16 and the second reduced-electric field region 17 are formed. P-type impurity ions, such as aluminum ions that can provide a p-type, are implanted into the epitaxial layer 21. With this arrangement, the first reduced-electric field region 16 and the second reduced-electric field region 17 are formed. Each of the first reduced-electric field region 16 and second reduced-electric field region 17 is formed within the epitaxial layer 21 so as not to be exposed to a surface of the epitaxial layer 21. The first reduced-electric field region 16 and the second reduced-electric field region 17 may be formed simultaneously or separately. An implantation energy of the p-type impurity ion, during formation of the first reduced-electric field region 16 and the second reduced-electric field region 17, may be greater than or equal to 700 keV and less than or equal to 1200 keV. A peak depth for the effective concentration of the p-type impurity in each of the first reduced-electric field region 16 and the second reduced-electric field region 17, with reference to the first principal surface 1, may be, for example, greater than or equal to 0.8 µm and less than or equal to 1.0 µm.

Then, as illustrated in FIG. 2C, a step of forming the sixth region 11F is performed. For example, a masking layer (not illustrated) having an opening is formed on a region in which the sixth region 11F is to be formed, i.e., on a region between the first reduced-electric field region 16 and the second reduced-electric field region 17 in the direction parallel to the second principal surface 2. Then, n-type impurity ions, such as nitrogen, that can provide an n-type, are implanted into the epitaxial layer 21. In such a process, the sixth region 11F is formed. In the epitaxial layer 21, the seventh region 11G includes a portion disposed on the side of the silicon carbide single crystal substrate 50 with respect to the first reduced-electric field region 16, includes a portion disposed on the side of the silicon carbide single crystal substrate 50 with respect to the sixth region 11F, and includes a portion disposed on the side of the silicon carbide single crystal substrate 50 with respect to the second reduced-electric field region 17. The effective concentration of the n-type impurity in the sixth region 11F is greater than the effective concentration of the n-type impurity in the seventh region 11G. Implantation energy of the n-type impurity ions, during the formation of the sixth region 11F, may be greater than or equal to 400 keV and less than or equal to 800 keV.

Figure 2D:
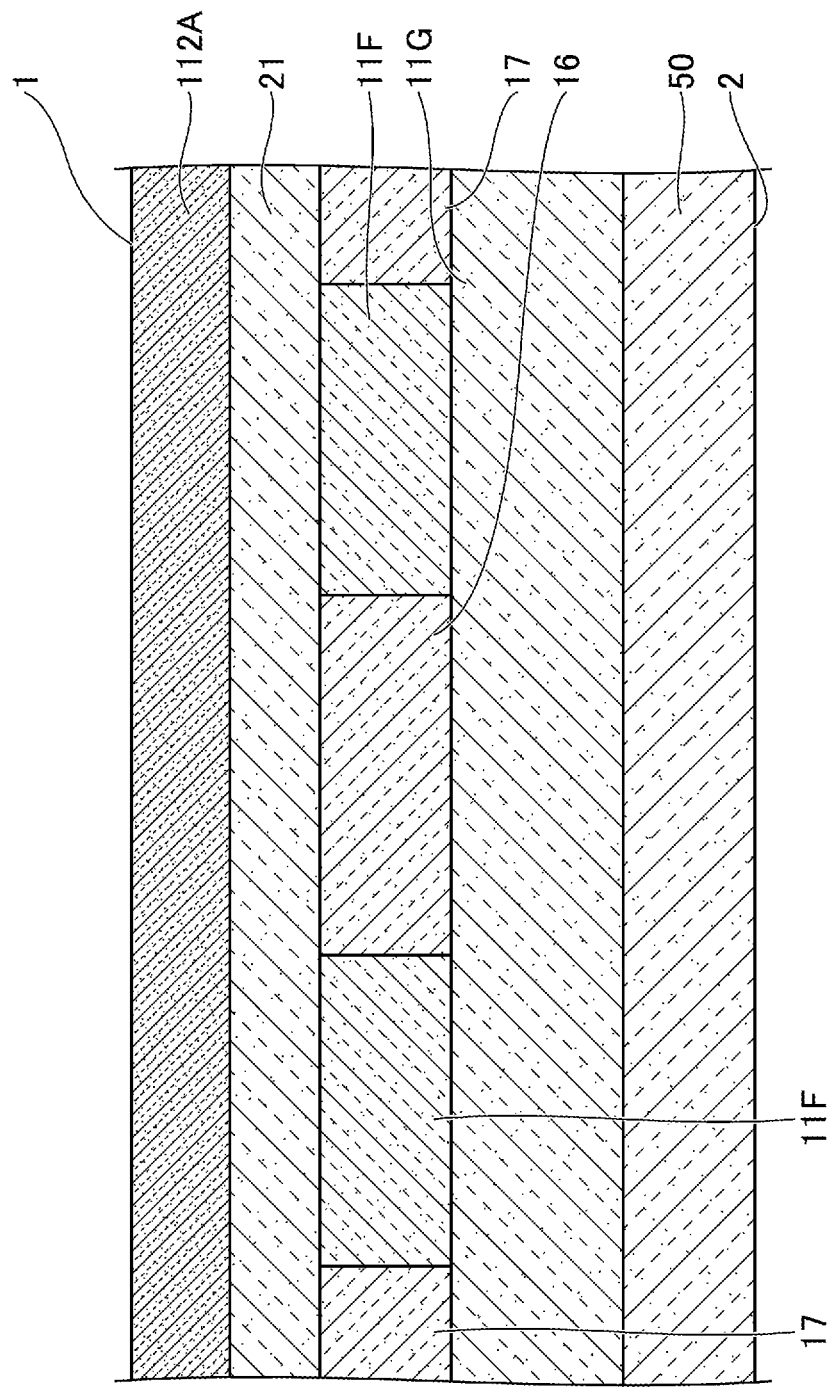
FIG. 2D is a cross-sectional view (fourth part) of the silicon carbide semiconductor device according to the embodiment, the cross-sectional view being for describing the method of manufacturing the silicon carbide semiconductor device.

Then, as illustrated in FIG. 2D, a step of forming the third region 12C of the body region 12 and a portion of the fourth region 12D is performed. For example, p-type impurity ions, such as aluminum ions, that can provide a p-type, are implanted into the entire surface of the epitaxial layer 21. In such a process, the p-type impurity region 112A that forms the third region 12C of the body region 12 and a portion of the fourth region 12D is formed. The implantation energy of the p-type impurity ions, during the formation of the p-type impurity region 112A, may be greater than or equal to 200 keV and less than or equal to 400 keV. The thickness of the p-type impurity region 112A is greater than or equal to 0.2 µm and less than or equal to 0.5 µm.

Figure 2E:
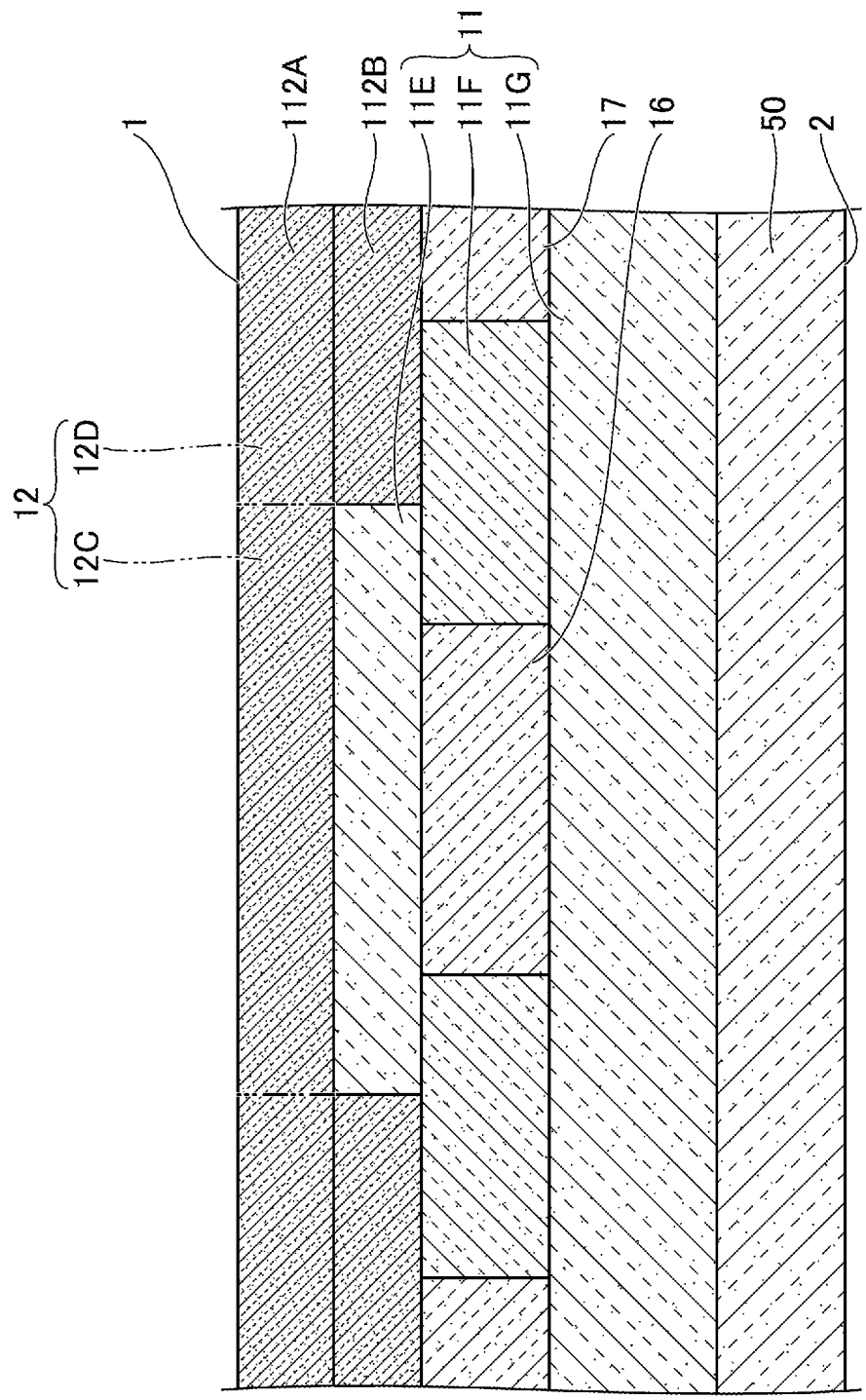
FIG. 2E is a cross-sectional view (fifth part) of the silicon carbide semiconductor device according to the embodiment, the cross-sectional view being for describing a method of manufacturing the silicon carbide semiconductor device.

Then, as illustrated in FIG. 2E, a step of forming the remainder of the fourth region 12D is performed. For example, a mask layer (not illustrated) having an opening is on a region in which the fourth region 12D is to be formed. P-type impurity ions, such as aluminum ions, that can provide a p-type are then implanted into the epitaxial layer 21. In such a process, the p-type impurity region 112B that forms the remainder of the fourth region 12D is formed. Implantation energy of the p-type impurity ions, during formation of the p-type impurity region 112B, may be greater than or equal to 300 keV and less than or equal to 500 keV. The lower end surface of the p-type impurity region 112B may contact the upper end surface 95 of the second reduced-electric field region 17. A portion of the p-type impurity region 112B may overlap the p-type impurity region 112A.

In such a manner, the body region 12 that includes the p-type impurity region 112A and the p-type impurity region 112B is formed. The fourth region 12D is composed of the p-type impurity region 112B and a portion of the p-type impurity region 112A that overlaps the p-type impurity region 112B in a plan view viewed in the direction perpendicular to the first principal surface 1. The third region 12C is composed of the remainder of the p-type impurity region 112A.

In the epitaxial layer 21, a portion between the body region 12 and a given region, among the first reduced-electric field region 16, the second reduced-electric field region 17, and the sixth reduced-electric field region 11F, forms the fifth region 11E. For example, the effective concentration of the n-type impurity in the fifth region 11E is less than the effective concentration of the n-type impurity in the sixth region 11F.

Figure 2F:
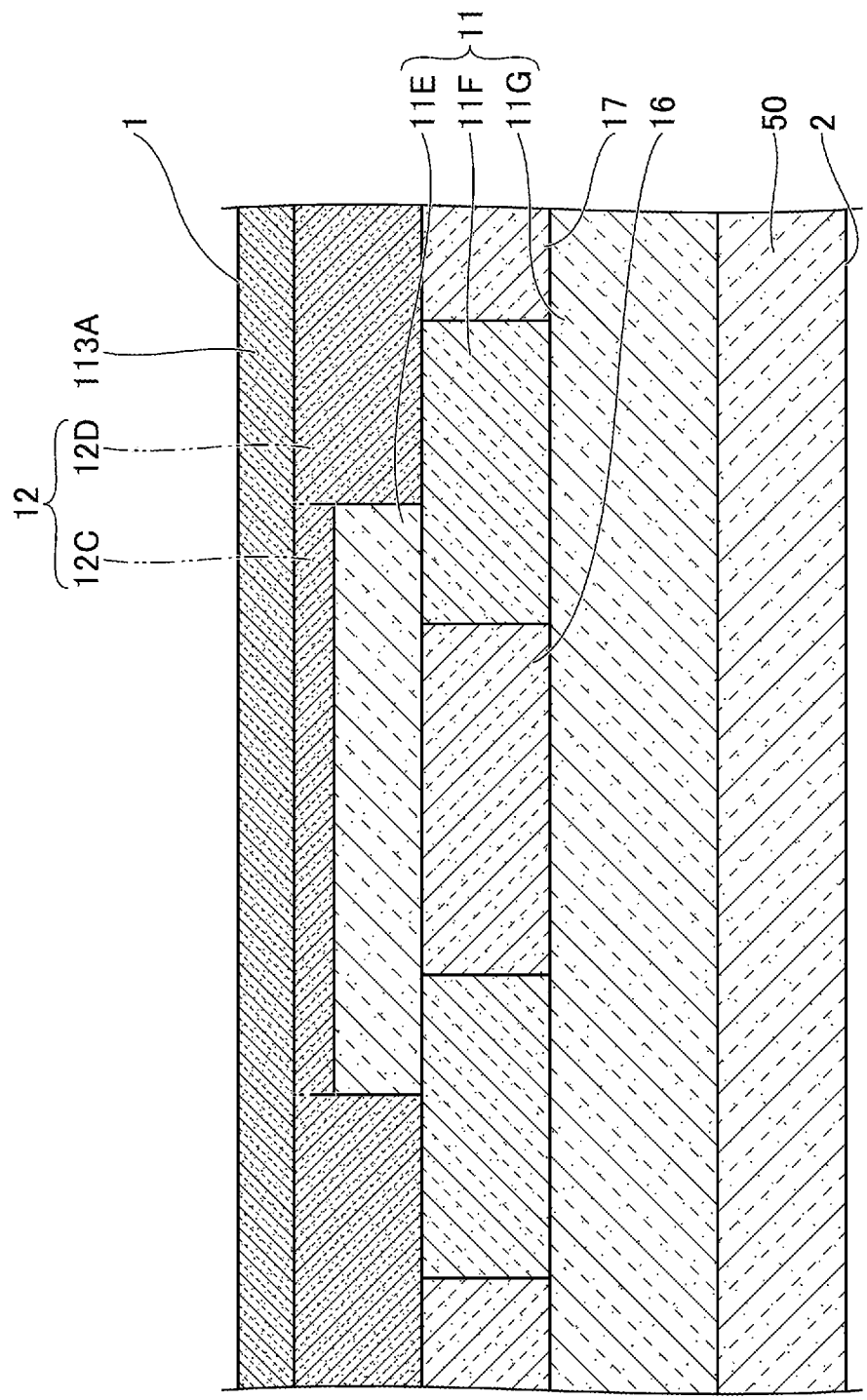
FIG. 2F is a cross-sectional view (sixth part) of the silicon carbide semiconductor device according to the embodiment, the cross-sectional view being for describing the method of manufacturing the silicon carbide semiconductor device.

Then, as illustrated in FIG. 2F, a step of forming the first region 13A of the source region 13 and a portion of the second region 13B is performed. For example, n-type impurity ions, such as phosphorus, that can provide an n-type are implanted into the entire surface of the epitaxial layer 21. In such a process, the first region 13A, and an n-type impurity region 113A that forms a portion of the second region 13B are formed. Implantation energy of the n-type impurity ions, during the formation of the n-type impurity region 113A, may be greater than 50 keV and less than or equal to 150 keV. The thickness of the n-type impurity region 113A is, for example, greater than or equal to 0.1 μm and less than or equal to 0.3 μm.

Then, as illustrated in FIG. 2G, a step of forming the remainder of the second region 13B is performed. For example, a mask layer (not illustrated) having an opening is formed on a region in which the second region 13B is to be formed. Then, n-type impurity ions, such as phosphorus, that can provide the n-type are implanted into the epitaxial layer 21. In such a process, the n-type impurity region 113B that forms the remainder of the second region 13B is formed. Implantation energy of the n-type impurity ions, during the formation of the n-type impurity region 113B, may be greater than or equal to 100 keV and less than or equal to 300 keV. A portion of the re-type impurity region 113B may overlap the n-type impurity region 113A.

In such a manner, the source region 13 that includes the n-type impurity region 113A and the n-type impurity region 113B is formed. The second region 13B is composed of the n-type impurity region 113B and a portion of the n-type impurity region 113A that overlaps the n-type impurity region 113B in a plan view viewed in the direction perpendicular to the first principal surface 1. The first region 13A is composed of the remainder of the n-type impurity region 113A.

Figure 2H:
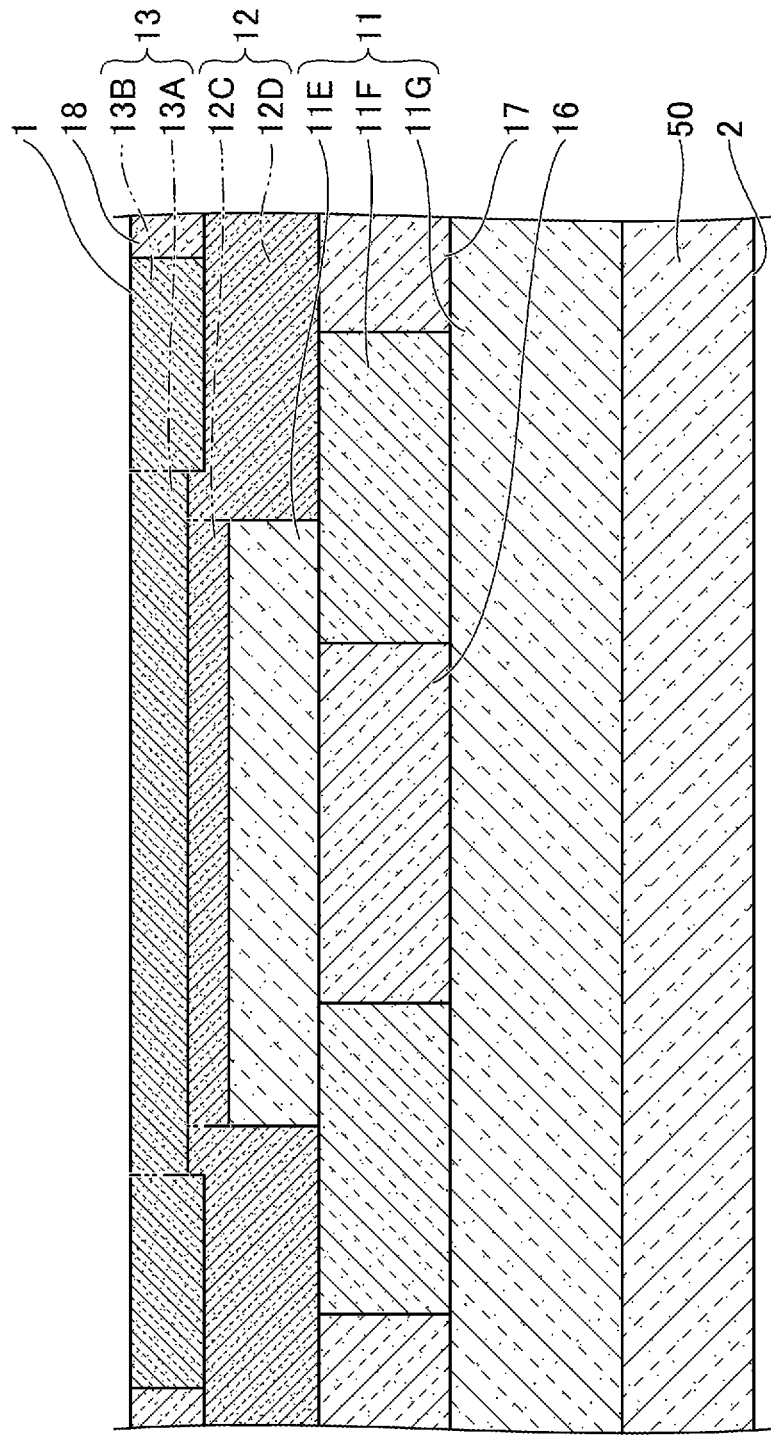
FIG. 2H is a cross-sectional view (eighth part) of the silicon carbide semiconductor device according to the embodiment, the cross-sectional view being for describing the method of manufacturing the silicon carbide semiconductor device.

Then, as illustrated in FIG. 2H, a step of forming a contact region 18 is performed. For example, a mask layer (not illustrated) having an opening is formed on a region in which the contact region 18 is to be formed. Then, p-type impurity ions, e.g., aluminum ions, that can provide a P-type are implanted into the source region 13 and the body region 12. In such a process, the contact region 18 in contact with the body region 12 is formed. The implantation energy of the p-type impurity ions, during the formation of the contact region 18, may be greater than or equal to 50 keV and less than or equal to 300 keV.

Activation anneal is then performed to activate the impurity ions implanted into the silicon carbide substrate 1C. The temperature of the activation anneal is preferably greater than or equal to 1500° C. and less than or equal to 1900° C. For example, such a temperature is about 1700° C. A time period of the activation anneal is, for example, about 30 minutes. The atmosphere of the activation anneal is preferably an inert gas atmosphere. For example, such an atmosphere is an Ar atmosphere.

Figure 2I:
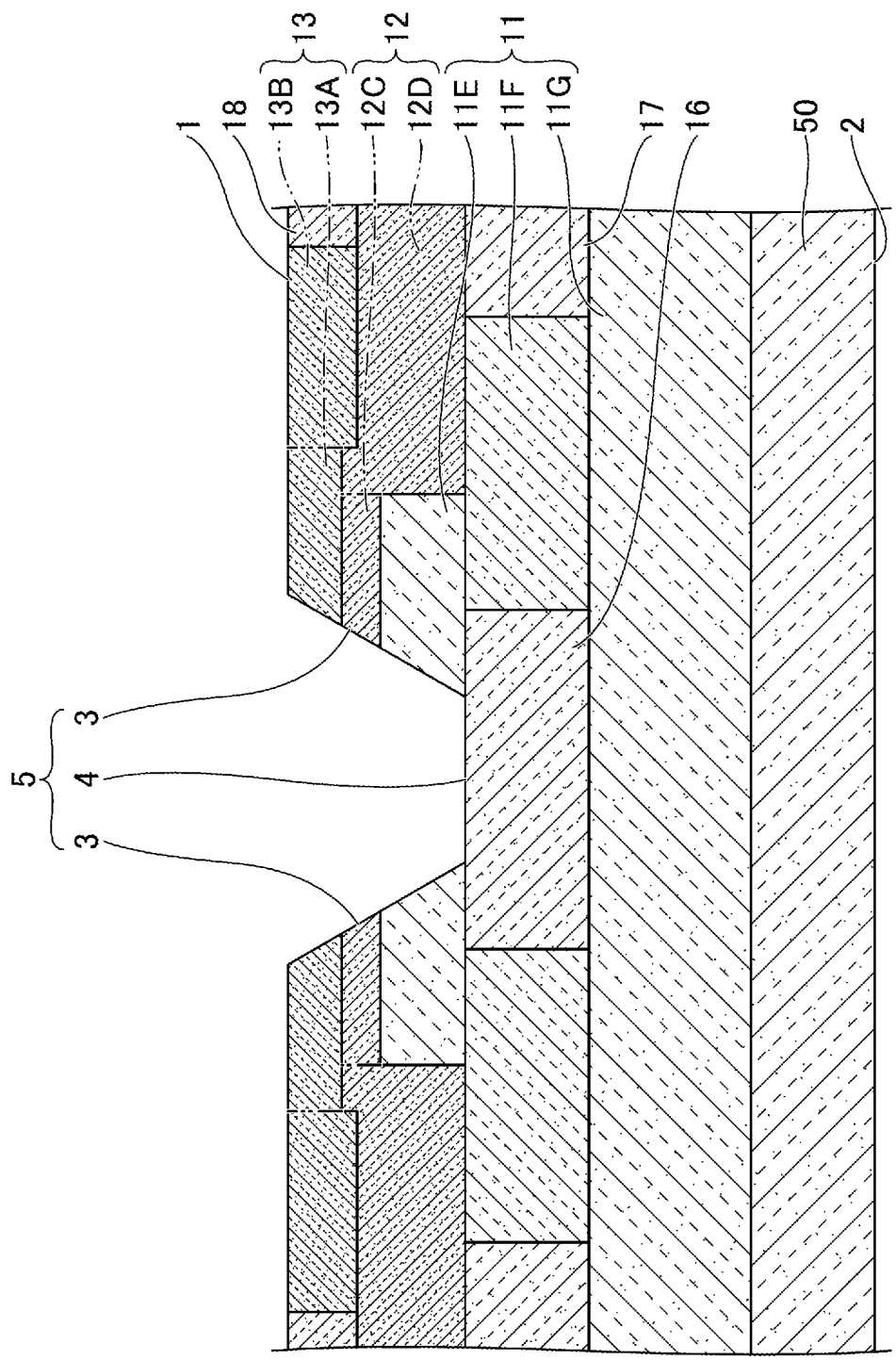
FIG. 2I is a cross-sectional view (ninth part) of the silicon carbide semiconductor device according to the embodiment, the cross-sectional view being for describing a method of manufacturing the silicon carbide semiconductor device.

As illustrated in FIG. 2I, a step of forming the gate trench 5 is performed. For example, a mask layer (not illustrated) having an opening at a location at which the gate trench 5 is to be formed is formed on the first principal surface 1, which is composed of the source region 13 and the contact region 18. The mask layer is used to remove a portion of the source region 13, a portion of the body region 12, and a portion of the drift region 11 in an etch process. In the etch process, for example, a reactive ion etch can be performed. Particularly, an inductively coupled plasma reactive ion etch can be performed. Specifically, for example, the inductively coupled plasma reactive ion etch that uses sulfur hexafluoride ($SF_6$) or a mixture of $SF_6$ and oxygen ($O_2$) as a reaction gas can be performed. In the etch, a recess (not illustrated) is formed in a region in which the gate trench 5 is to be formed to have a side portion, which is substantially perpendicular to the first principal surface 1, and a bottom portion that is continuously provided with the side portion and is substantially parallel to the first principal surface 1.

A thermal etch is then performed with respect to the recess. In a state in which a mask layer is formed on the first principal surface 1, the thermal etch may be performed by, for example, heating in an atmosphere including a reaction gas with at least one kind of halogen atoms. The at least one kind of the halogen atoms includes at least one of chlorine (Cl) atoms or fluorine (F) atoms. Such an atmosphere includes, for example, chlorine ($Cl_2$), boron trichloride ($BCl_3$), $SF_6$, or carbon tetrafluoride ($CF_4$). For example, a thermal etch is performed where a mixture of chlorine gas and oxygen gas is used as a reaction gas and a thermal etch is performed at a heat treatment temperature that is, for example, greater than or equal to 800° C. and less than or equal to 900° C. The reaction gas may include a carrier gas in addition to the above-described chlorine gas and oxygen gas. For example, nitrogen gas, argon gas, or helium gas may be used as a carrier gas.

In the thermal etch, the gate trench 5 is formed on the first principal surface 1 of the silicon carbide substrate 10. The gate trench 5 is defined by the side surface 3 and the bottom surface 4. The side surface 3 is formed by the source region 13, the body region 12, and the drift region 11. The bottom surface 4 is formed by the first reduced-electric field region 16. An angle 81 between the side surface 3 and a plane including the bottom surface 4 is, for example, greater than or equal to 45° and less than or equal to 65°. Then, the mask layer is removed from the first principal surface 1.

Figure 2J:
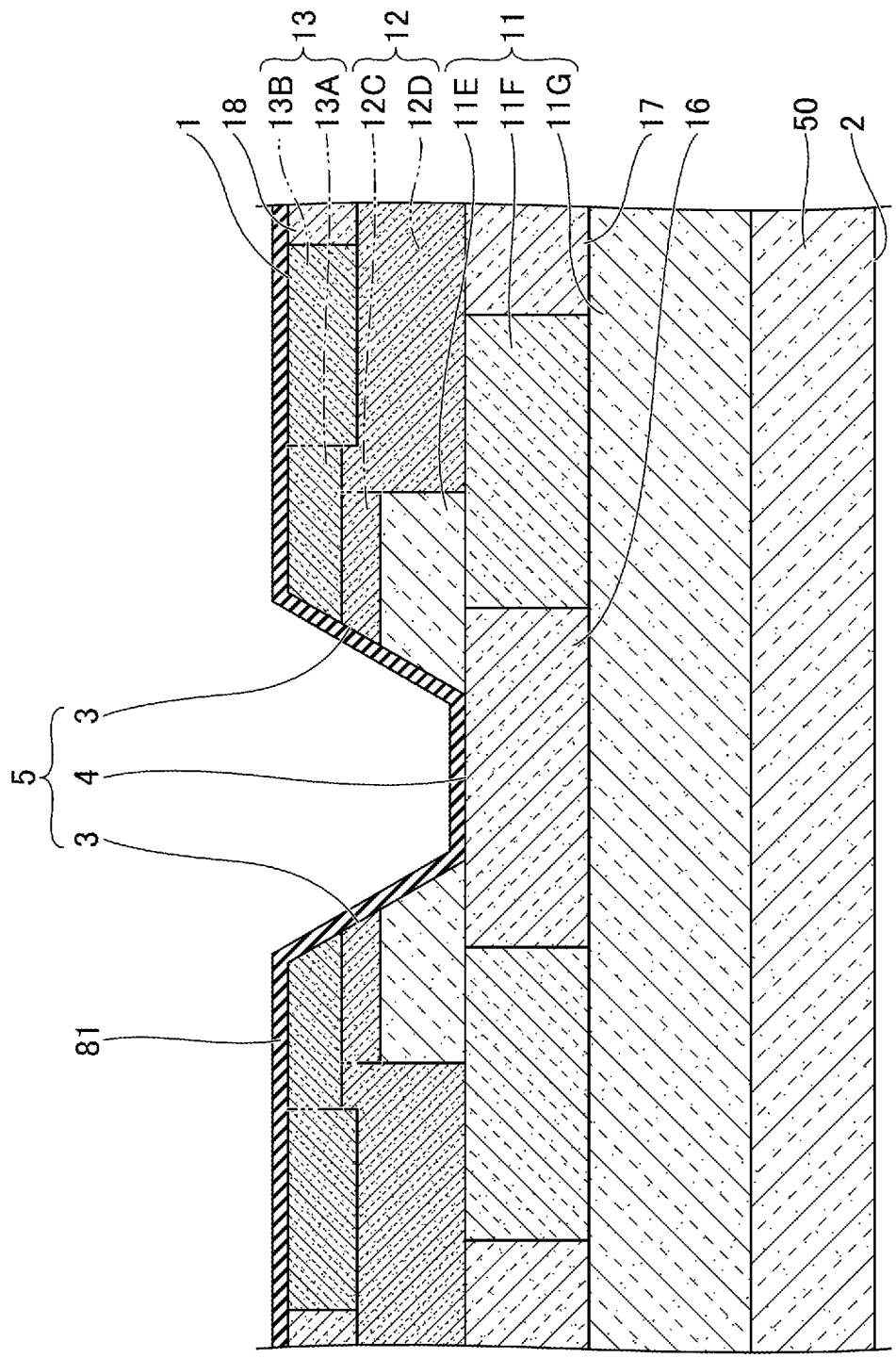
FIG. 2J is a cross-sectional view (tenth part) of the silicon carbide semiconductor device according to the embodiment, the cross-sectional view being for describing the method of manufacturing the silicon carbide semiconductor device.

Then, as illustrated in FIG. 2J, a step of forming the gate dielectric film 81 is performed. For example, by thermally oxidizing the silicon carbide substrate 10, the gate dielectric film 81 that contacts each of the source region 13, the body region 12, the drift region 11, the first reduced-electric field region 16, and the contact region 18 is formed. Specifically, the silicon carbide substrate 10 is heated in an atmosphere including oxygen, at a temperature that is, for example, greater than or equal to 1300° C. and less than or equal to 1400° C. In such a process, the first principal surface 1, and the gate dielectric film 81 that contacts each of the side surface 3 and the bottom surface 4 are formed.

The silicon carbide substrate 10 may then be heat treated (NO annealing) in a nitric oxide (NO) gas atmosphere. In the NO annealing, the silicon carbide substrate 10 is retained for about one hour, under a condition in which the temperature is greater than or equal to 1100° C. and less than or equal to 1400° C., for example. In such a process, nitrogen atoms are introduced into an interface region between the gate dielectric film 81 and the body region 12. As a result, channel mobility can be improved by suppressing formation of an interface state in the interface region.

After the NO annealing, Ar annealing using argon (Ar) as an atmosphere gas may be performed. A heating temperature in the Ar annealing is, for example, greater than or equal to a heating temperature in the NO annealing described above. A time period for the Ar annealing is about one hour, for example. In such a process, formation of the interface state at the interface region between the gate dielectric film 81 and the body region 12 is further suppressed. Other inert gases such as nitrogen gas may be used as the atmosphere gas, instead of the Ar gas.

Figure 2K:
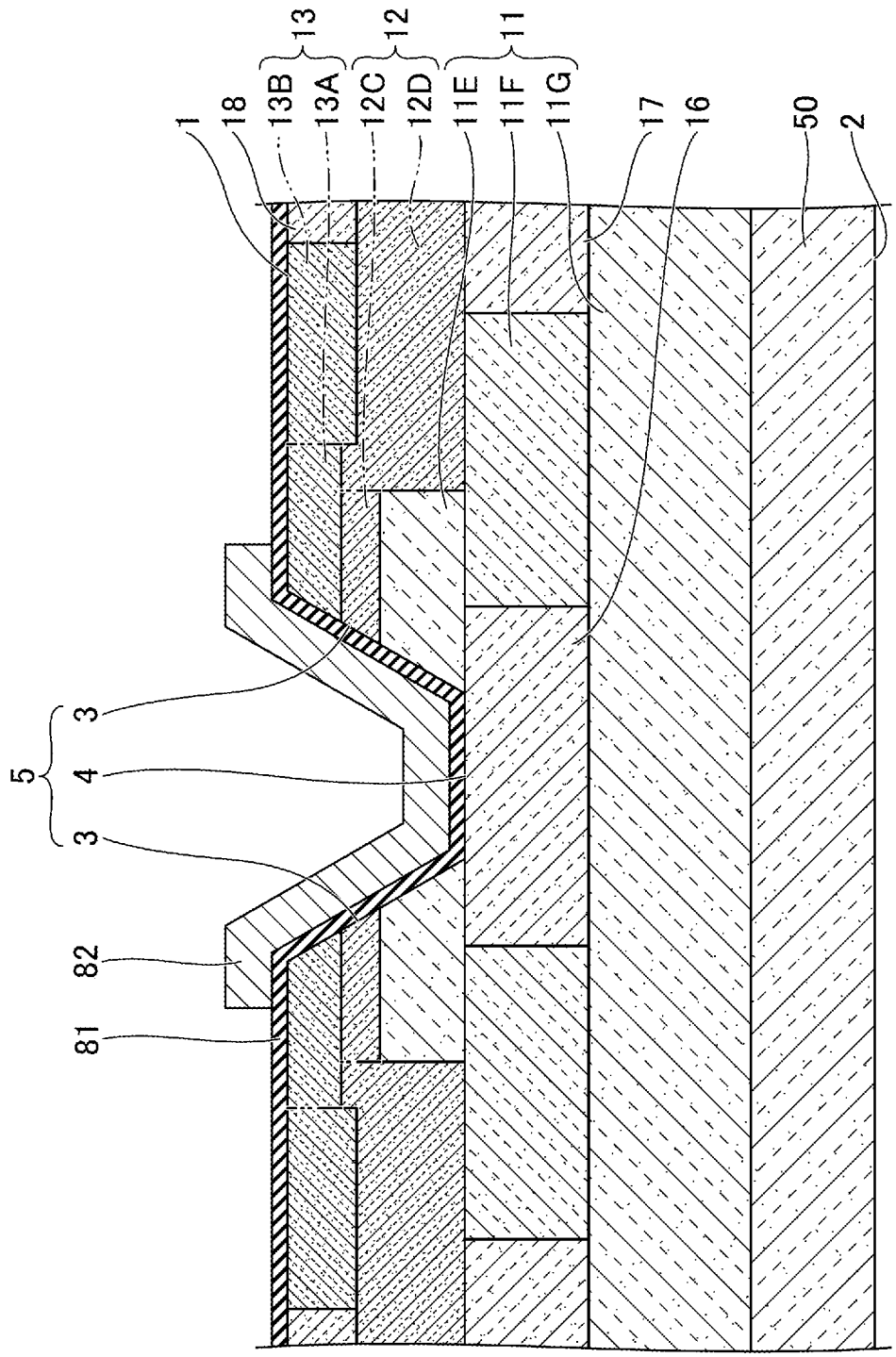
FIG. 2K is a cross-sectional view (eleventh part) of the silicon carbide semiconductor device according to the embodiment, the cross-sectional view being for describing the method of manufacturing the silicon carbide semiconductor device.

Then, a step of forming the gate electrode 82 is performed as illustrated in FIG. 2K. The gate electrode 82 is formed on the gate dielectric film 81. The gate electrode 82 is formed by, for example, low pressure CVD (Low Pressure-Chemical Vapor Deposition: LP-CVD). The gate electrode 82 is formed so as to face each of the source region 13, the body region 12, and the drift region 11.

Figure 2L:
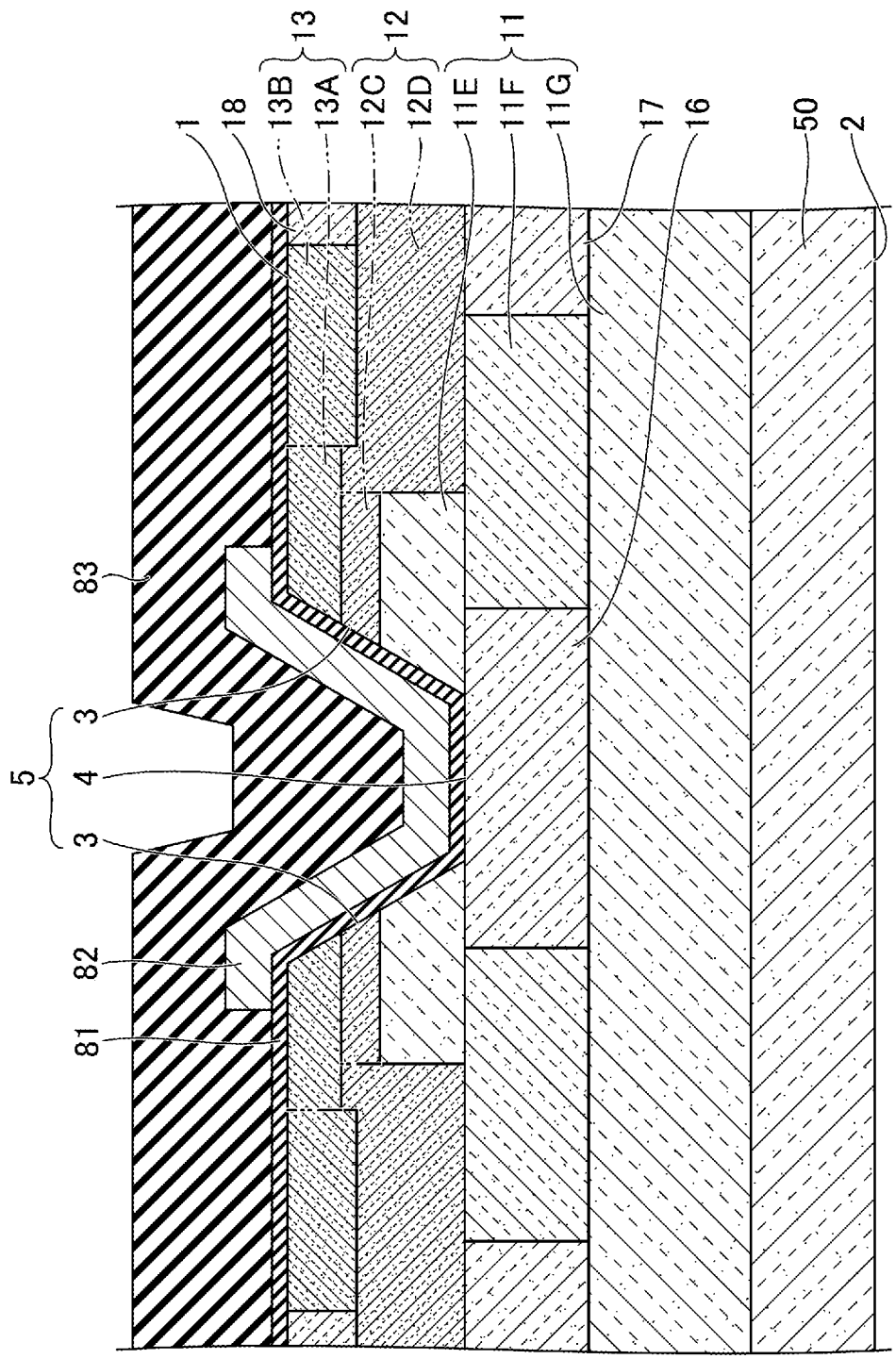
FIG. 2L is a cross-sectional view (twelfth part) of the silicon carbide semiconductor device according to the embodiment, the cross-sectional view being for describing the method of manufacturing the silicon carbide semiconductor device.

Then, as illustrated in FIG. 2L, a step of forming the interlayer dielectric film 83 is performed. Specifically, the interlayer dielectric film 83 is formed so as to cover the gate electrode 82 and contact the gate dielectric film 81. The interlayer dielectric film 83 is formed by, for example, CVD. The interlayer dielectric film 83 is made of a material that includes, for example, silicon dioxide. A portion of the interlayer dielectric film 83 may be formed within the gate trench 5.

Figure 2M:
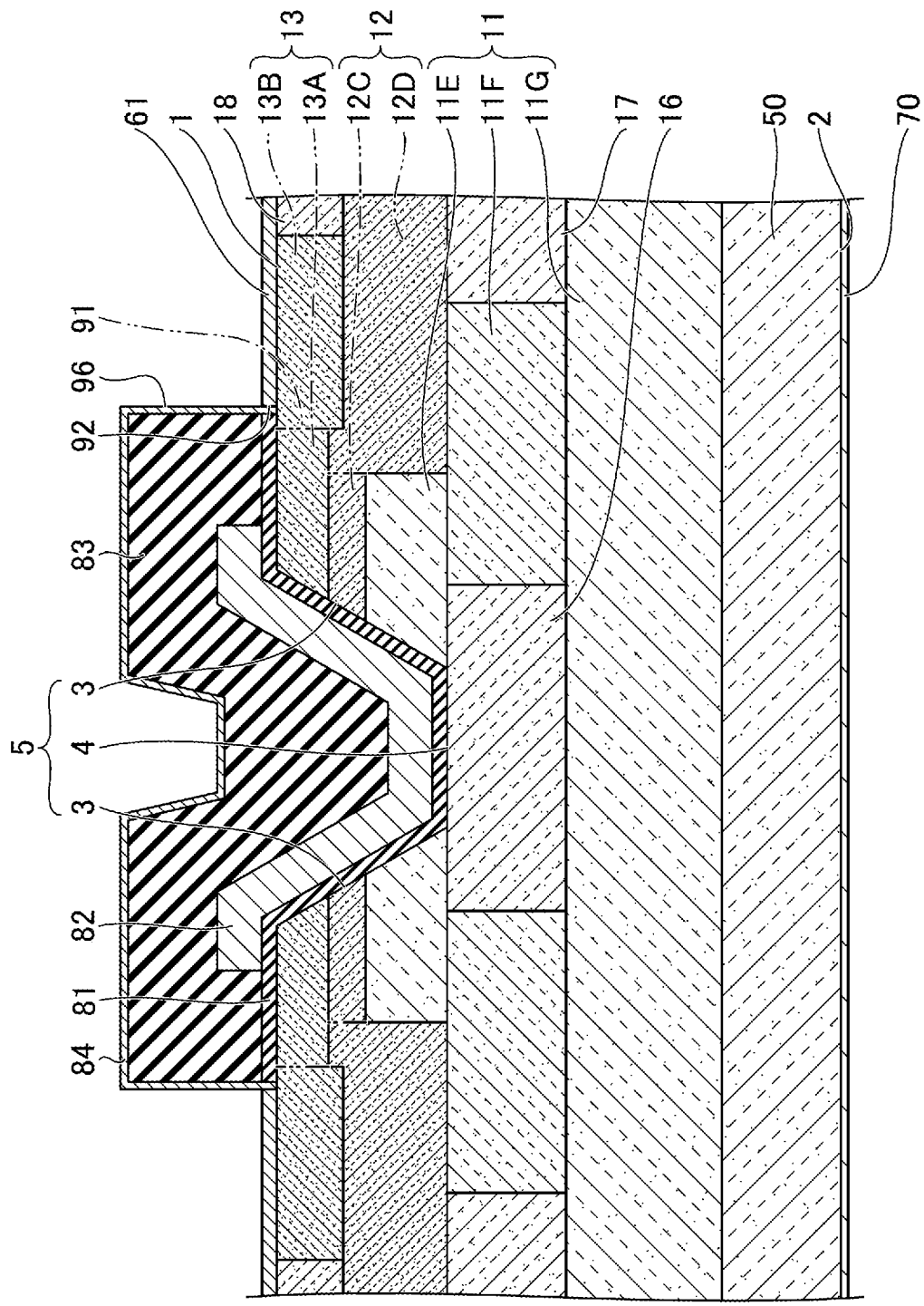
FIG. 2M is a cross-sectional view (thirteenth part) of the silicon carbide semiconductor device according to the embodiment, the cross-sectional view being for describing the method of manufacturing the silicon carbide semiconductor device.

Then, as illustrated in FIG. 2M, a step of forming the barrier metal film 84, the contact electrode 61, and the drain electrode 70 is performed. For example, an etch is performed such that an opening is formed in the interlayer dielectric film 83 and the gate dielectric film 81 and thus the second region 13B of the source region 13 and the contact region 18 are each exposed from the interlayer dielectric film 83 and the gate dielectric film 81. The first region 13A of the source region 13 is preferably covered by the gate dielectric film 81 and the interlayer dielectric film 83. Then, the barrier metal film 84 that covers the top surface and side surface of the interlayer dielectric film 83 and the side surface of the gate dielectric film 81 is formed. Preferably, the first region 13A is inside a side end surface 96 of the barrier metal film 84, in a plan view viewed in the direction perpendicular to the first principal surface 1. The barrier metal film 84 is made of a material that includes, for example, TiN. The barrier metal film 84 is formed by, for example, sputter deposition and reactive ion etching (RIE). Then, a metal film (not illustrated) for the contact electrode 61 that contacts the second region 13B and the contact region 18 is formed on the first principal surface 1. The metal film for the contact electrode 61 is formed by, for example, sputtering. The metal film for the contact electrode 61 is made of a material that includes, for example, Ni. Then, a metal film (not illustrated) for the drain electrode 70 that contacts the silicon carbide single crystal substrate 50 is formed on the second principal surface 2. The metal film for the drain electrode 70 is formed by, for example, sputtering. The metal film for the drain electrode 70 is formed of a material that includes, for example, Ni.

Annealing for alloying is then performed. A metal film for the contact electrode 61 and a metal film for the drain electrode 70 are retained, for example, for about 5 minutes at a temperature that is greater than or equal to 900° C. and less than or equal to 1100° C. In such a process, at least a portion of the metal film for the contact electrode 61 and at least a portion of the metal film for the drain electrode 70 react with silicon included in the silicon carbide substrate 10 to allow for silicidation. Thus, the contact electrode 61, which has an ohmic junction with the second region 13B of the source region 13, and the drain electrode 70 that has an ohmic junction with the silicon carbide single crystal substrate 50 are formed. In a plan view viewed in the direction perpendicular to the first principal surface 1, when the first region 13A is inside the side end surface 96 of the barrier metal film 84, the contact electrode 61 is formed such that the side end surface 92 is spaced farther apart from the gate trench 5 than the interface 91 between the first region 13A and the second region 13B. Although a portion of the second region 13B is consumed by silicidation, the first region 13A is not consumed because the first region 13A is covered by the gate dielectric film 81 and the interlayer dielectric film 83. The contact electrode 61 may have an ohmic junction with the contact region 18. The contact electrode 61 may be made of a material that includes Ti, Al, and Si. The drain electrode 70 may be made of a material that includes Ti, Al, and Si.

Figure 2N:
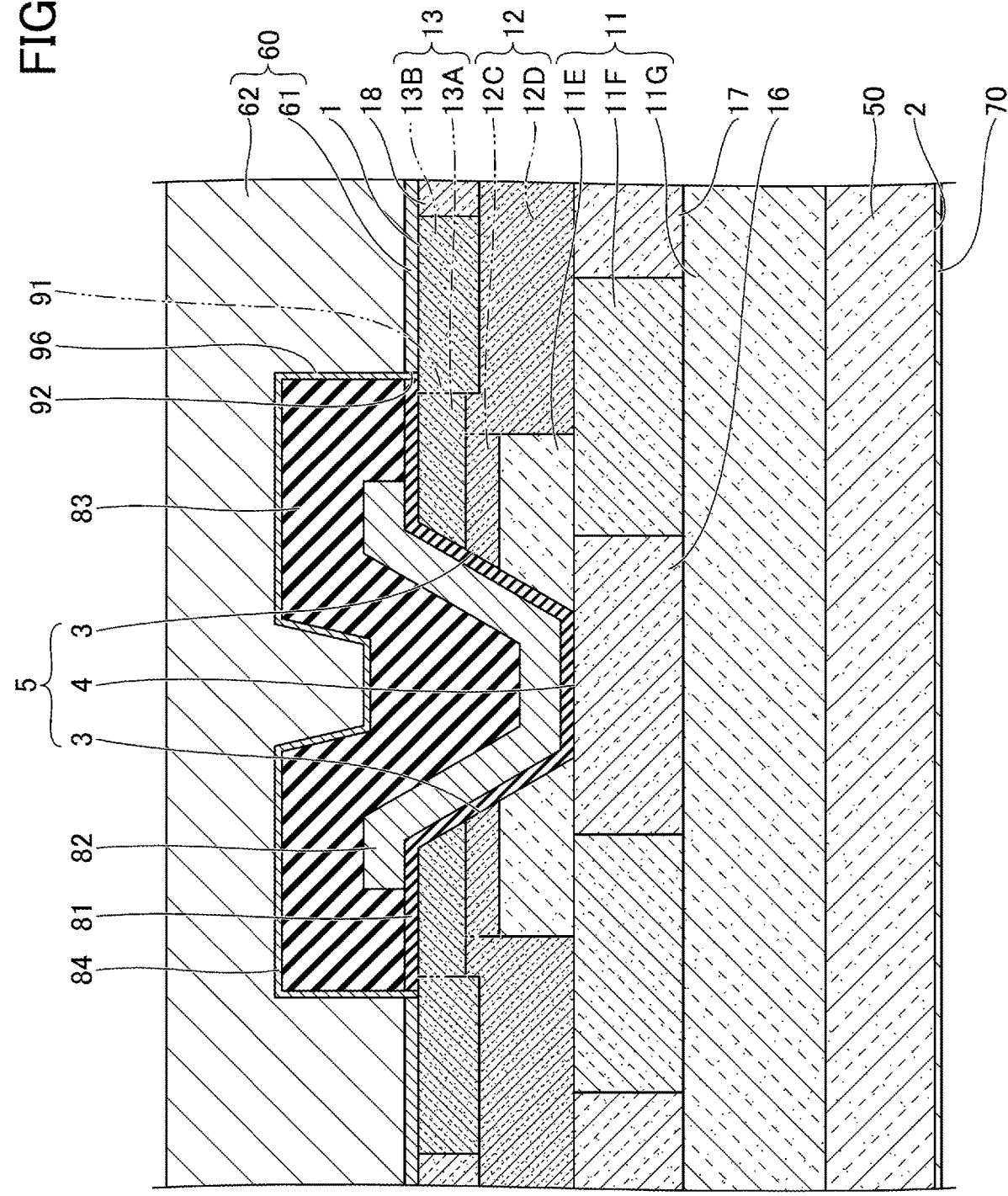
FIG. 2N is a cross-sectional view (fourteenth part) of the silicon carbide semiconductor device according to the embodiment, the cross-sectional view being for describing the method of manufacturing the silicon carbide semiconductor device.

Then, as illustrated in FIG. 2N, a step of forming the source line 62 is performed. Specifically, the source line 62 that covers the contact electrode 61 and the barrier metal film 84 is formed. The source line 62 is formed by, for example, sputter deposition and RIE. The source line 62 is made of a material that includes, for example, aluminum. In such a manner, the source electrode 60 that includes the contact electrode 61 and the source line 62 is formed.

Then, as illustrated in FIG. 2O, a step of forming the passivation film 85 is performed. Specifically, the passivation film 85 that covers the source line 62 is formed. The passivation film 85 is made of a material that includes, for example, polyimide. The passivation film 85 is formed by, for example, coating.

In such a manner, the MOSFET 100 according to the embodiment is completed.

Hereafter, the effect of the MOSFET according to the present embodiment will be described.

In the MOSFET 100 according to the present embodiment, the contact electrode 61 has an ohmic junction with the second region 13B. Even if a portion of the second region 13B is consumed during heat treatment for the ohmic junction, consumption of the first region 13A is suppressed. Thus, the function of the source region 13 can be secured. With this arrangement, a peak depth D1 for the effective concentration of the p-type impurity in the first reduced-electric field region 16, with reference to the first principal surface 1, can be reduced. For example, even when the peak depth D1 is greater than or equal to 0.8 µm and less than or equal to 1.0 µm, excellent characteristics can be obtained. Also, when the peak depth D1 is reduced, regrowth of the epitaxial layer is not required after formation of the first reduced-electric field region 16, which differs from the above-described manufacturing method. Thus, a cost caused by the regrowth of the epitaxial layer can be reduced. Also, during the formation of the first reduced-electric field region 16, high energy ion implantation is not required. Thus, increases in the cost caused by high energy ion implantation can be avoided. Further, as a smaller first thickness T1 of the first region 13A is obtained, a drain current during a short circuit event is reduced, and thus short circuit capability can be improved. Further, as an area in contact with the side surface 3 of the fifth region 11E is reduced, feedback capacitance is reduced. By reducing the feedback capacitance, losses in switching are reduced, and thus a switching speed can be improved.

Thus, according to the present embodiment, the cost can be reduced while suppressing deterioration of characteristics.

In a plan view viewed in the direction perpendicular to the first principal surface 1, the side end surface 92 is spaced farther apart from the gate trench 5 than the interface 91, and thus consumption of the first region 13A can be more reliably suppressed. When the gate dielectric film 81 directly contacts the first region 13A, consumption of the first region 13A can be further suppressed reliably. Even if a portion of the first region 13A directly contacts the interlayer dielectric film 83 instead of the gate dielectric film 81, consumption of the first region 13A can be reliably suppressed.

Because the body region 12 includes the fourth region 12D with the second lower end surface 94, in addition to including the third region 12C with the first lower end surface 93, punch-through between the second region 13B and the drift region 11 can be suppressed even when a higher voltage is applied to the drain electrode 70. In other words, excellent drain withstand pressure can be obtained.

With the second reduced-electric field region 17 being provided between the second lower end surface 94 and the second principal surface 2, electric insulation breakdown in the gate dielectric film 81 can be suppressed, and thus excellent dielectric withstand pressure can be obtained. When the upper end surface 95 of the second reduced-electric field region 17 and the second lower end surface 94 of the fourth region 12D come into contact with each other, a greater dielectric withstand voltage can be obtained more reliably.

Preferably, the second thickness T2 for the second region 13B is 0.2 μm or more. This is because, even when the second region is consumed during the ohmic junction with the contact electrode 61, short-circuiting between the contact electrode 61 and the body region 12 is more reliably suppressed. More preferably, the second thickness T2 is 0.3 μm or more.

Preferably, the second thickness T2 is greater than or equal to 1.1 times and less than or equal to 5.0 times the first thickness T1. If the second thickness T2 is less than 1.1 times the first thickness T1, the first thickness T1 may be excessively great or the second thickness T2 may be excessively small. When the first thickness T1 is excessively great, the first reduced-electric field region 16 is unlikely to be formed at low cost in an attempt to ensure sufficient thicknesses of the body region 12 and the drift region 11. When the second thickness T2 is excessively small, a short circuit between the contact electrode 61 and the body region 12 is likely to occur. When the second thickness T2 is greater than 5.0 times the first thickness T1, the first thickness T1 may be excessively small or the second thickness T2 may be excessively great. When the first thickness T1 is excessively small, the function of the source region 13 is unlikely to be secured sufficiently. When the second thickness T2 is excessively great, the body region 12 is deeply formed, which tends to increase a cost caused by ion implantation. Accordingly, preferably, the second thickness T2 is greater than or equal to 1.1 times and less than or equal to 5.0 times the first thickness T1, and more preferably the second thickness T2 is greater than or equal to 1.2 times and less than or equal to 4.0 times the first thickness T1.

Preferably, the peak depth D1 for the effective concentration of the p-type impurity in the first reduced-electric field region 16, with reference to the first principal surface 1, is 1.0 μm or less. This is because manufacturing can be performed at low cost.

With the side surface 3 of the gate trench 5 having a {0-33-8} plane, excellent mobility for the channel can be obtained and thus channel resistance can be reduced.

As illustrated in FIG. 3, the gate dielectric film 81 has the side end surface 97 facing the side end surface 92 of the contact electrode 61, and further, in a plan view viewed in the direction perpendicular to the first principal surface 1, the side end surface 97 may be provided on the side of the gate trench 5 with respect to the interface 91. In this case, preferably, the side end surface 96 that contacts the contact electrode 61 of the barrier metal film 84 is provided so as to be spaced farther apart from the gate trench 5 than the interface 91. FIG. 3 is a cross-sectional view of an example of association of the source region 13, the gate dielectric film 81, and the barrier metal film 84 with the contact electrode 61.

[Modification]

Figure 4:
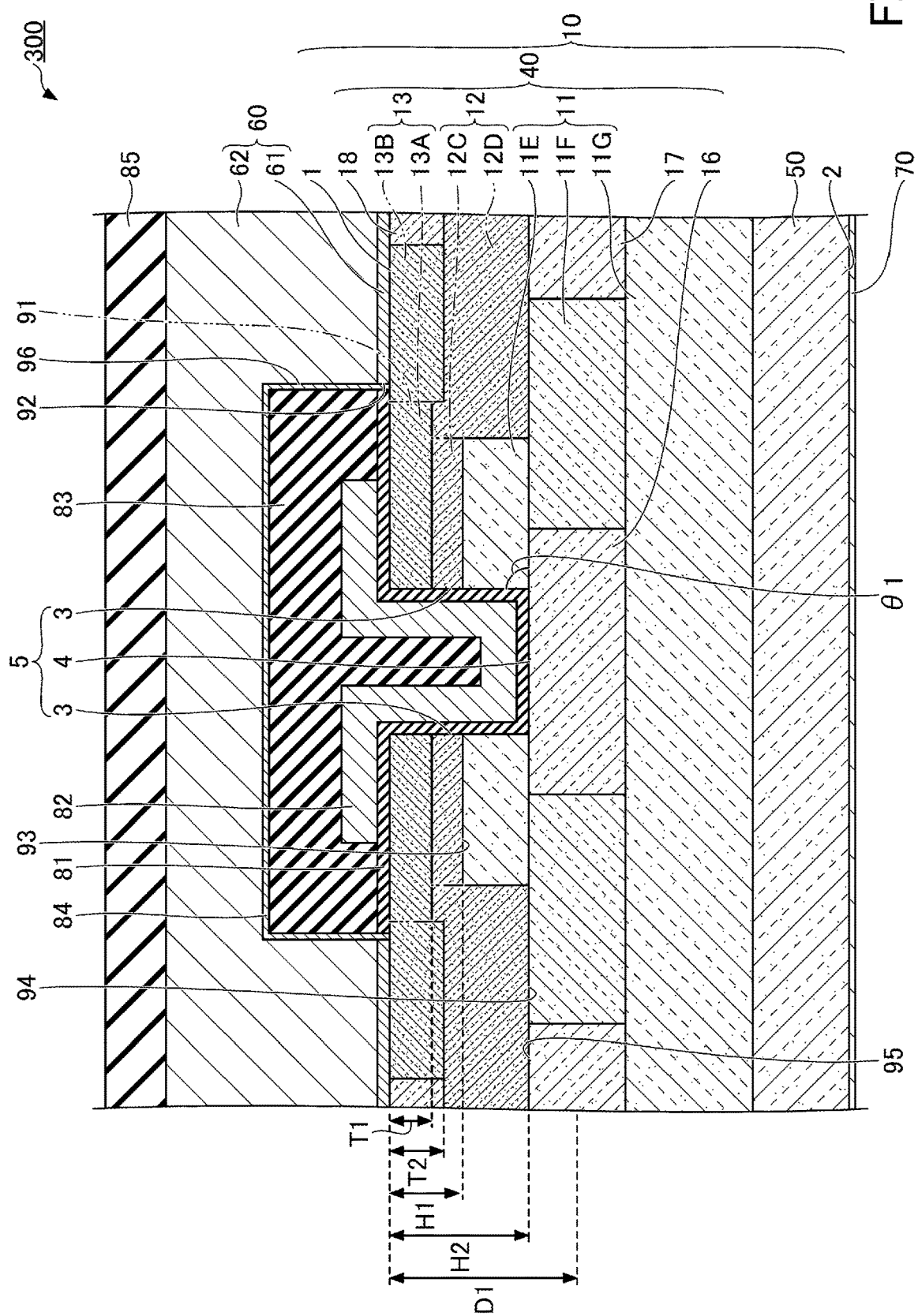
FIG. 4 is a cross-sectional view of the configuration of the silicon carbide semiconductor device according to a modification of the embodiment.

Hereafter, a modification of the embodiment will be described. The modification mainly differs from the embodiment in the shape of the gate trench. FIG. 4 is a cross-sectional view of the configuration of the MOSFET (silicon carbide semiconductor device) according to the modification of the embodiment.

As illustrated in FIG. 4, in a MOSFET 300 according to the modification, the gate trench 5 is a vertical trench. That is, an angle θ1 of the side surface 3 relative to a plane including the bottom surface 4 may be 90°. Other configurations are the same as the configuration described in the embodiment.

In such a modification, the same effect as that described in the embodiment can be obtained.

The above embodiment and reference example are described as a case in which the n-type is a first conductive type and the p-type is a second conductive type. However, the p-type is the first conductive type and the n-type may be the second conductive type. Although the above embodiment and reference example have been described using an example of the MOSFET as a silicon carbide semiconductor device, the silicon carbide semiconductor device may be, for example, an insulated gate bipolar transistor (IGBT) or the like. The effective concentration of the p-type impurity and the effective concentration of the n-type impurity in each of impurity regions can be measured by, for example, scanning capacitance microscopy (SCM), secondary ion mass spectrometry (SIMS), or the like. The location of an interface (i.e., a pn junction interface) between the p-type region and the n-type region can be determined by, for example, SCM, SIMS, or the like. Distribution of the effective concentration of multiple carriers in a current spreading region can be determined based on the distribution of the thickness of a depletion layer that is generated by, for example, a pn junction between the current spreading region and the body region, without measuring the effective concentration. The thickness of the depletion layer can be determined by, for example, SCM, SIMS, or the like.

Although the embodiments have been described in detail, particular embodiments are not limiting. Various changes and modifications can be made within the scope set forth in the claims.

REFERENCE SIGNS LIST 1 first principal surface
2 second principal surface
3 side surface
4 bottom surface
5 gate trench 10 silicon carbide substrate
11 drift region
11E fifth region
11F sixth region
11G seventh region
12 body region
12C third region
12D fourth region
13 source region
13A first region
13B second region
16 first reduced-electric field region
17 second reduced-electric field region
18 contact region
21 epitaxial layer
40 silicon carbide epitaxial layer
50 silicon carbide single crystal substrate
60 source electrode
61 contact electrode
62 source line
70 drain electrode
81 gate dielectric film
82 gate electrode
83 interlayer dielectric film
84 barrier metal film
85 passivation film
91 interface
92, 96, 97 side end surface
93 first lower end surface
94 second lower end surface
95 upper end surface
100, 300 silicon carbide semiconductor device (MOSFET)
112A, 112B p-type impurity region
113A, 113B n-type impurity region
D1 depth
H1, H2 distance
T1 first thickness
T2 second thickness
θ1 angle

The invention claimed is:

1. A silicon carbide semiconductor device comprising:
a silicon carbide substrate having a first principal surface and a second principal surface opposite to the first principal surface,
wherein the silicon carbide substrate includes
a drift region having a first conductive type,
a body region disposed on the drift region and having a second conductive type different from the first conductive type, and
a source region disposed on the body region so as to be separated from the drift region, the source region having the first conductive type,
wherein a gate trench is provided on the first principal surface, the gate trench being defined by: a side surface, which passes through the source region and the body region and reaches the drift region; and a bottom surface coupled to the side surface,
wherein the silicon carbide substrate further includes a first reduced-electric field region provided between the bottom surface and the second principal surface and having the second conductive type,
wherein the source region includes
a first region contacting the side surface, the first region having a first thickness,
a second region having a second thickness greater than the first thickness, the first region being interposed between the second region and the side surface, and
wherein the silicon carbide semiconductor device further includes a contact electrode with an ohmic junction with the second region,
wherein the body region of the silicon carbide substrate includes
a third region including a first lower end surface coupled to the side surface of the gate trench, the third region having the second conductive type, and
a fourth region including a second lower end surface coupled to the first lower end surface of the third region, the fourth region having the second conductive type, and the third region being interposed between the side surface of the gate trench and the fourth region, and
wherein an effective concentration of a second conductive-type impurity in the fourth region is less than an effective concentration of a second conductive-type impurity in the third region.

2. The silicon carbide semiconductor device according to claim 1, wherein the contact electrode has a side end surface that faces a side of the gate trench in a direction parallel to the first principal surface, and
wherein the side end surface is spaced farther apart from the gate trench than an interface between the first region and the second region, in a plan view viewed in a direction perpendicular to the first principal surface.

3. The silicon carbide semiconductor device according to claim 2, further comprising:
a gate dielectric film contacting the side surface and the bottom surface;
a gate electrode disposed on the gate dielectric film such that the gate dielectric film is interposed between the gate electrode and the silicon carbide substrate; and
an interlayer dielectric film disposed so as to cover the gate electrode,
wherein the gate dielectric film or the interlayer dielectric film directly contacts the first region.

4. The silicon carbide semiconductor device according to claim 1,
wherein a second distance from the first principal surface to the second lower end surface is greater than or equal to a first distance from the first principal surface to the first lower end surface, and
wherein the second lower end surface overlaps the second region and is wider than the second region, in a plan view viewed in a direction perpendicular to the first principal surface.

5. The silicon carbide semiconductor device according to claim 1, wherein the silicon carbide substrate is disposed between a portion of the second lower end surface of the fourth region in the body region and the second principal surface, and the silicon carbide substrate further includes a second reduced-electric field region having the second conductive type.

6. The silicon carbide semiconductor device according to claim 5, wherein the second reduced-electric field region includes an upper end surface in contact with a portion of the second lower end surface of the fourth region in the body region.

7. The silicon carbide semiconductor device according to claim 1, wherein the second thickness is 0.2 μm or more.

8. The silicon carbide semiconductor device according to claim 1, wherein the second thickness is greater than or equal to 1.1 times and less than or equal to 5.0 times the first thickness.

9. The silicon carbide semiconductor device according to claim 1, wherein a peak depth for an effective concentration of a second conductive-type impurity in the first reduced-electric field region, with reference to the first principal surface, is 1.0 μm or less.

10. The silicon carbide semiconductor device according to claim 1, wherein the side surface of the gate trench includes a {0-33-8} plane.

* * * * *